(12) United States Patent  
Yoneyama et al.

(10) Patent No.: US 10,030,174 B2
(45) Date of Patent: Jul. 24, 2018

(54) COMPOSITE SHEET FOR FORMING PROTECTIVE FILM

(71) Applicant: LINTEC CORPORATION, Itabashi-ku (JP)

(72) Inventors: Hiroyuki Yoneyama, Nagareyama (JP); Naoya Saiki, Koshigaya (JP)

(73) Assignee: LINTEC CORPORATION, Itabashi-ku (JP)

( * ) Notice: Subject to any disclaimer, the term of this patent is extended or adjusted under 35 U.S.C. 154(b) by 145 days.

(21) Appl. No.: 14/778,802

(22) PCT Filed: Mar. 26, 2014

(86) PCT No.: PCT/JP2014/058699
§ 371 (c)(1),
(2) Date: Sep. 21, 2015

(87) PCT Pub. No.: WO2014/157426
PCT Pub. Date: Oct. 2, 2014

(65) Prior Publication Data
US 2016/0046840 A1  Feb. 18, 2016

(30) Foreign Application Priority Data
Mar. 27, 2013  (JP) .................. 2013-066682

(51) Int. Cl.
*H01L 23/544* (2006.01)
*H01L 23/552* (2006.01)
(Continued)

(52) U.S. Cl.
CPC ............... *C09J 7/0275* (2013.01); *C09J 7/20* (2018.01); *C09J 7/243* (2018.01);
(Continued)

(58) Field of Classification Search
None
See application file for complete search history.

(56) References Cited

U.S. PATENT DOCUMENTS

2006/0204749 A1  9/2006 Kita et al.
2011/0074050 A1  3/2011 Amano et al.
(Continued)

FOREIGN PATENT DOCUMENTS

CN  1123919 C  10/2003
CN  102029655 A  4/2011
(Continued)

OTHER PUBLICATIONS

Combined Office Action and Search Report dated Nov. 30, 2016 in Chinese Patent Application No. 201480017872 .7 (with English translation of category of cited documents).
(Continued)

*Primary Examiner* — Frank D Ducheneaux
(74) *Attorney, Agent, or Firm* — Oblon, McClelland, Maier & Neustadt, L.L.P.

(57) ABSTRACT

A protective film-forming composite sheet 10 comprises a pressure sensitive adhesive sheet 16 in which a pressure sensitive adhesive layer 12 is provided on a base material 11, a protective film-forming film 13, and a release film 14. When α (mN/25 mm) represents the maximum peel force between the protective film-forming film 13 and the release film 14; β (mN/25 mm) represents the minimum peel force between the pressure sensitive adhesive sheet 16 and the protective film-forming film 13; and γ (mN/25 mm) represents the maximum peel force between the pressure sensitive adhesive sheet 16 and the protective film-forming film 13, the following relationships (1) to (3) hold for α, β, and γ;

$$\beta \geq 70 \quad (1)$$

$$\alpha/\beta \leq 0.50 \quad (2)$$

$$\gamma \leq 2000 \quad (3).$$

7 Claims, 6 Drawing Sheets

(51) Int. Cl.
 *C09J 7/38* (2018.01)
 *C09J 7/40* (2018.01)
 *C09J 7/20* (2018.01)
 *C09J 7/02* (2006.01)
 *H01L 21/683* (2006.01)
 *C09J 7/24* (2018.01)

(52) U.S. Cl.
 CPC ............ *H01L 21/6836* (2013.01); *C09J 7/38* (2018.01); *C09J 7/40* (2018.01); *C09J 2201/606* (2013.01); *C09J 2201/622* (2013.01); *C09J 2203/326* (2013.01); *H01L 23/544* (2013.01); *H01L 23/552* (2013.01); *H01L 2221/68327* (2013.01); *H01L 2221/68377* (2013.01); *H01L 2223/54433* (2013.01); *H01L 2924/0002* (2013.01)

(56) References Cited

U.S. PATENT DOCUMENTS

| | | | |
|---|---|---|---|
| 2011/0156280 A1 | 6/2011 | Takamoto et al. | |
| 2011/0217501 A1 | 9/2011 | Shishido et al. | |
| 2012/0028442 A1* | 2/2012 | Takamoto | C09J 5/06 438/460 |

FOREIGN PATENT DOCUMENTS

| | | |
|---|---|---|
| CN | 102161869 A | 8/2011 |
| CN | 102653661 A | 9/2012 |
| JP | 2009-130320 A | 6/2009 |
| JP | 2010-56328 A | 3/2010 |
| JP | 2011-151362 A | 8/2011 |
| JP | 2011-176327 A | 9/2011 |
| JP | 2011-228450 A | 11/2011 |
| JP | 2011-228451 A | 11/2011 |
| JP | 2012-33637 A | 2/2012 |
| JP | 4904432 B1 | 3/2012 |
| JP | 2012-207179 A | 10/2012 |
| JP | 2013-21270 A | 1/2013 |
| TW | 201137069 A1 | 11/2011 |

OTHER PUBLICATIONS

Combined Office Action and Search Report dated Nov. 17, 2015 in Taiwanese Patent Application No. 103111371 (with English translation of categories of cited documents).

International Search Report dated Jun. 24, 2014, in PCT/JP2014/058699 filed Mar. 26, 2014.

Extended European Search Report dated Oct. 19, 2016 in Patent Application No. 14773558.3.

* cited by examiner (A)

(B)

COMPOSITE SHEET FOR FORMING PROTECTIVE FILM

This application is the U.S. National Stage of International Application No. PCT/JP2014/058699, and claims benefit of priority from JP Patent Application No. 2013-066682, filed Mar. 27, 2013, the contents of which are incorporated by reference.

TECHNICAL FIELD

The present invention relates to a protective film-forming composite sheet in which a protective film-forming film, for example for the purpose of protecting semiconductors, is formed on a pressure sensitive adhesive sheet, particularly to a protective film-forming composite sheet having both functions of a protective film-forming film and a dicing tape.

BACKGROUND ART

Conventionally, manufacturing a semiconductor device using a mounting method called a facedown method has been performed. In the facedown method, the chip surface having an electrode such as a bump formed thereon is joined facing a substrate or the like. On the other hand, since the chip back surface is naked, it is protected by a protective film. The protective film has been formed, for example, by resin coating or the like, but a method in which the protective film is formed by laminating a protective film-forming film to the back surface of a semiconductor wafer has also been employed in recent years.

Further, it is widely known that when a semiconductor wafer is singulated for each circuit to prepare a semiconductor chip, a dicing tape is bonded to the back surface of the semiconductor wafer in order to fix the semiconductor wafer.

The protective film-forming film and the dicing tape may be integrated for use as a protective film-forming composite sheet for the purpose of reducing manufacturing cost, simplification of steps, and the like. Specifically, the protective film-forming composite sheet is formed by laminating the protective film-forming film to the surface of a pressure sensitive adhesive of a pressure sensitive adhesive sheet in which a pressure sensitive adhesive layer is provided on a base material (refer to Patent Documents 1 to 4). Patent Documents 1 and 2 disclose, in the protective film-forming composite sheet, adjusting the peel force between the pressure sensitive adhesive layer and the protective film-forming film to a specific range. Patent Documents 3 and 4 disclose a radiation curable pressure sensitive adhesive layer in which the adhesion to a film for the back surface of a flip chip-type semiconductor is reduced by irradiating with radiation and a pressure sensitive adhesive layer previously cured by irradiating with radiation.

CITATION LIST

Patent Literature

Patent Document 1: Japanese Patent Laid-Open No. 2011-151362
Patent Document 2: Japanese Patent Laid-Open No. 2012-33637
Patent Document 3: Japanese Patent Laid-Open No. 2011-228450
Patent Document 4: Japanese Patent Laid-Open No. 2011-228451

SUMMARY OF INVENTION

Technical Problem

The above protective film-forming composite sheet is commonly conveyed and used in a rolled form or as a laminate of sheets, and in these cases, a release film for protection is bonded to the protective film-forming composite film. The release film is removed by peeling when the protective film-forming composite sheet is bonded to a wafer. At the same time when the release film is removed by peeling, delamination may occur between the protective film-forming film and the pressure sensitive adhesive layer. However, when a semiconductor chip is prepared using a protective film-forming composite sheet in which delamination has occurred, the performance of retaining a wafer by the pressure sensitive adhesive layer may be reduced to cause a problem during dicing, or the performance of protecting the semiconductor chip by a protective film may be reduced.

Further, after the protective film-forming composite sheet is bonded to a wafer and the wafer is diced to form chips in a dicing step, each chip having a protective film is commonly peeled from the pressure sensitive adhesive layer before the protective film is cured. However, when the peel force between the pressure sensitive adhesive layer and the protective film-forming film is increased, excessive force may act on a chip when the chip is peeled, causing chip defects such as chipping of a chip.

Although any one of the delamination and the chip defects can be prevented to some extent by adjusting the peel force between the pressure sensitive adhesive layer and the protective film-forming film as disclosed in Patent Documents 1 and 2, it is difficult to sufficiently prevent both of the delamination and the chip defects.

The present invention has been made in view of the above problems, and an object of the present invention is to provide a protective film-forming composite sheet which allow a semiconductor chip having a protective film to be picked up without causing chip defects while preventing the delamination between a pressure sensitive adhesive layer and a protective film-forming film when a release film is peeled.

Solution to Problem

As a result of extensive and intensive studies, the present inventors have found that the maximum peel force between a protective film-forming film and a pressure sensitive adhesive layer needs to be set to a predetermined value or less in order to minimize chip defects when a semiconductor chip having a protective film is picked up, and at the same time, the minimum peel force between the protective film-forming and the pressure sensitive adhesive layer also needs to be controlled in order to prevent the delamination between the pressure sensitive adhesive layer and the protective film-forming film. In addition, the present inventors have also found that the minimum peel force between the pressure sensitive adhesive layer and the protective film-forming film needs to be set to a predetermined value or more, and at the same time, the ratio of the peel force between the protective film-forming film and a release film to the minimum peel force between the pressure sensitive adhesive layer and the protective film-forming film needs to be set to a predetermined value, and have completed the present invention to be described below.

Specifically, the present invention provides the following [1] to [5].

[1] A protective film-forming composite sheet comprising a pressure sensitive adhesive sheet in which a pressure sensitive adhesive layer is provided on a base material, a protective film-forming film bonded to the pressure sensitive adhesive layer, and a release film bonded to a surface of the protective film-forming film opposite to a surface bonded to the pressure sensitive adhesive layer, wherein when α (mN/25 mm) represents the maximum peel force between the protective film-forming film and the release film; β (mN/25 mm) represents the minimum peel force between the pressure sensitive adhesive sheet and the protective film-forming film; and γ (mN/25 mm) represents the maximum peel force between the pressure sensitive adhesive sheet and the protective film-forming film, as measured using a test piece having a width of 25 mm at a peel angle of 180 degrees, a measurement temperature of 23° C., and a peel rate of 300 mm/min, the following relationships (1) to (3) hold for α, β, and γ:

$$\beta \geq 70 \tag{1}$$

$$\alpha/\beta \leq 0.50 \tag{2}$$

$$\gamma \leq 2000 \tag{3}.$$

[2] The protective film-forming composite sheet according to [1], wherein when γ' (mN/25 mm) represents the maximum peel force between the protective film-forming film after curing and the pressure sensitive adhesive sheet as measured using a test piece having a width of 25 mm at a peel angle of 180 degrees, a measurement temperature of 23° C., and a peel rate of 300 mm/min, the following relationship (4) is satisfied:

$$\gamma' \leq 2000 \tag{4}.$$

[3] The protective film-forming composite sheet according to the above [2], wherein the base material is a polypropylene film or a cross-linked film thereof, or a laminated film of at least one of these films and another film.

[4] The protective film-forming composite sheet according to any one of [1] to [3], wherein the pressure sensitive adhesive layer comprises a non-energy ray-curable pressure sensitive adhesive or a pressure sensitive adhesive obtained by curing an energy ray-curable pressure sensitive adhesive.

[5] The protective film-forming composite sheet according to any one of [1] to [4], wherein the protective film-forming film comprises a filler, and in the protective film-forming film, the content of the filler is 45 to 80% by mass.

Advantageous Effects of Invention

According to the present invention, a release film can be peeled from a protective film-forming film without producing delamination between a pressure sensitive adhesive sheet and the protective film-forming film. Further, when a chip having a protective film is picked up, the generation of chip defects such as chipping of a chip can also be prevented.

DESCRIPTION OF EMBODIMENTS

Hereinafter, the present invention will be specifically described using the embodiments.

Note that, in the present specification, "(meth)acrylic" is used as a term meaning one or both of "acrylic" and "methacrylic". Further, "(meth)acrylate" is used as a term meaning one or both of "acrylate" and "methacrylate". Further, "(meth)acryloyl" is used as a term meaning one or both of "acryloyl" and "methacryloyl".

[Protective Film-Forming Composite Sheet]

Figure 1:
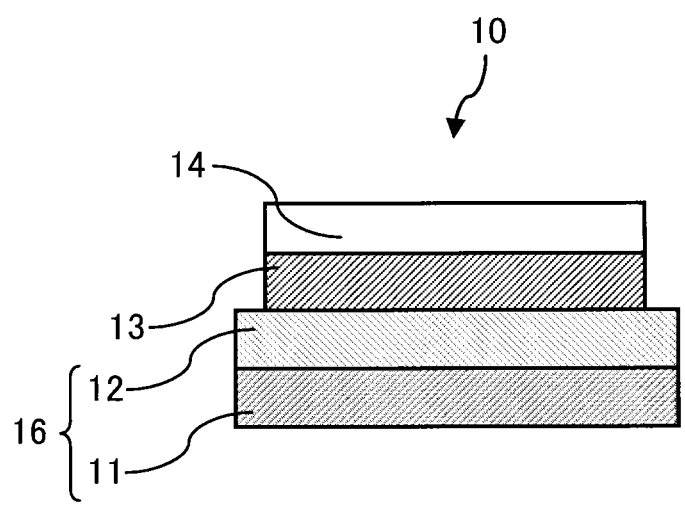
FIG. 1 is a schematic sectional view of the protective film-forming composite sheet of the present invention.

As shown in FIG. 1, a protective film-forming composite sheet 10 comprises a pressure sensitive adhesive sheet 16 in which a pressure sensitive adhesive layer 12 is provided on a base material 11, a protective film-forming film 13 bonded to the pressure sensitive adhesive layer 12, and a release film 14 bonded to a surface of the protective film-forming film 13 opposite to a surface bonded to the pressure sensitive adhesive layer 12.

[Peel Force Between Each Layer]

In the present invention, when α (mN/25 mm) represents the maximum peel force between the protective film-forming film 13 and the release film 14; β (mN/25 mm) represents the minimum peel force between the pressure sensitive adhesive sheet 16 and the protective film-forming film 13; and γ (mN/25 mm) represents the maximum peel force between the pressure sensitive adhesive sheet 16 and the protective film-forming film 13, as measured using a test piece having a width of 25 mm at a peel angle of 180 degrees, a measurement temperature of 23° C., and a peel rate of 300 mm/min, the following relationships (1) to (3) hold for α, β, and γ:

$$\beta \geq 70 \tag{1}$$

$$\alpha/\beta \leq 0.50 \tag{2}$$

$$\gamma \leq 2000 \tag{3}.$$

Note that α, β, and γ refer to the maximum peel force or the maximum peel force before curing the protective film-forming film 13. Note that the measuring method of these peel forces α, β, and γ is as described below.

If the minimum peel force β is less than 70 mN/25 mm, the difference between the minimum peel force β and the maximum peel force α cannot be increased, and it will be difficult to control the peel force ratio α/β to 0.5 or less.

Further, the minimum peel force β is preferably 250 mN/25 mm or more. When the minimum peel force β is 250 mN/25 mm or more, the tackiness of the pressure sensitive adhesive layer to which the protective film-forming film is bonded can be made relatively high. As a result, the pressure sensitive adhesive sheet can be fixed to a ring frame with high adhesive strength without taking particular measures such as separately providing a removable pressure sensitive adhesive layer having high tackiness in a region to be bonded to the ring frame or providing a plurality of pressure sensitive adhesive layers, as will be described below. Further, when the minimum peel force β is high, the range of the maximum peel force α that satisfies the relationship (2) described above is preferably increased. A film used as a process film when the protective film-forming composite sheet is manufactured is often used as it is as a release film to be bonded to the protective film-forming film. Therefore, when a release film in which the range of the maximum peel force α that can be selected is large, specifically a release film having a large maximum peel force α, can be used, the embodiment of the method for manufacturing the protective film-forming composite sheet that can be employed will be hardly limited.

If the maximum peel force γ is larger than 2000 mN/25 mm, chip defects such as chipping of a chip may occur when a chip having an uncured protective film-forming film is picked up from the pressure sensitive adhesive layer, as will be described below. Here, the maximum peel force γ is preferably 1700 mN/25 mm or less, more preferably 1000 mN/25 mm or less, from the point of view of reducing chip defects such as chipping of a chip.

Further, if the peel force ratio α/β is larger than 0.50, the delamination between the pressure sensitive adhesive sheet and the protective film-forming film is liable to occur. The peel force ratio α/β is more preferably 0.40 or less from the point of view of minimizing delamination. Further, the peel force ratio α/β is preferably 0.03 or more, more preferably 0.07 or more, but is not particularly limited thereto. The maximum peel force α can be prevented from becoming excessively small by setting the peel force ratio α/β to these lower limits or more.

The maximum peel force α of the release film is preferably, but not particularly limited to, 20 mN/25 mm or more. Unintended release or the like of the release film can be prevented by setting the maximum peel force α to 20 mN/25 mm or more. From such a point of view, the maximum peel force α is more preferably 30 mN/25 mm or more. Further, the maximum peel force α is preferably, but not particularly limited to, 300 mN/25 mm or less. The peel force ratio α/β is easily adjusted to a desired value by setting the maximum peel force α to 300 mN/25 mm or less. Further, from such a point of view, the maximum peel force α is more preferably 100 mN/25 mm or less.

Further, in the protective film-forming composite sheet of the present invention, when γ' (mN/25 mm) represents the maximum peel force between the protective film-forming film after curing and the pressure sensitive adhesive sheet as measured using a test piece having a width of 25 mm at a peel angle of 180 degrees, a measurement temperature of 23° C., and a peel rate of 300 mm/min, the following relationship (4) is preferably satisfied:

$$\gamma' \leq 2000 \qquad (4).$$

Note that the method for measuring the maximum peel force γ' is as describing below.

In the present invention, after curing the protective film-forming film by heating, a chip having a protective film-forming film may be picked up from the pressure sensitive adhesive layer, as will be described below. In this case, when the maximum peel force γ' after curing is 2000 mN/25 mm or less as described above, chip defects such as chipping of a chip are hard to occur during pickup. The maximum peel force γ' after curing is preferably 1700 mN/25 mm or less, more preferably 1000 mN/25 mm or less, further preferably 500 mN/25 mm or less, most preferably 300 mN/25 mm or less, from the point of view of reducing chip defects. Note that, when a chip is picked up from the pressure sensitive adhesive layer after curing the protective film-forming film, it seems that there is no technical significance in specifying the peel force between the pressure sensitive adhesive sheet and an uncured protective film-forming film because a chip having an uncured protective film-forming film is not picked up from the pressure sensitive adhesive layer. However, as described above, it is possible to obtain the working-effect of the present invention that, when an uncured protective film-forming film is bonded to an adherend, the occurrence of delamination between the pressure sensitive adhesive layer and the protective film-forming film during the peeling of the release film is suppressed by setting the peel force ratio α/β to a predetermined numerical value or less.

Hereinafter, each member which forms the protective film-forming composite sheet will be described further in detail.

(Pressure Sensitive Adhesive Sheet)
[Base Material]

A base material is a material for supporting a pressure sensitive adhesive layer and a protective film-forming film, and examples thereof to be used include films such as a polyethylene film, a polypropylene film, a polybutene film, a polybutadiene film, a polymethylpentene film, a polyvinylchloride film, a vinyl chloride copolymer film, a polyethylene terephthalate film, a polyethylene naphthalate film, a polybutylene terephthalate film, a polyurethane film, an ethylene-vinyl acetate copolymer film, an ionomer resin film, an ethylene-(meth)acrylic acid copolymer film, an ethylene-(meth)acrylate copolymer film, a polystyrene film, a polycarbonate film, a polyimide film, and a fluororesin film. A cross-linked film of these films can be also used. Furthermore, it may be a laminated film of these. In addition, a film obtained by coloring these films can also be used.

Among these films, a polypropylene film or a cross-linked film thereof, or a laminated film of at least one of these films and another film is preferred from the point of view of having heat resistance and easily obtaining the pickup suitability and the expansion suitability of a pressure sensitive adhesive sheet. Since these base materials have heat resistance, there are the following advantages. Also in the case where the protective film-forming composite sheet of the present invention is used in the process of picking up a chip having a protective film-forming film from a pressure sensitive adhesive layer after curing the protective film-forming film by heating, the base material having heat resistance suffers small damage by heat applied when it is heated together with the protective film-forming film. Therefore, a possibility of causing process problems resulting from damage by heat applied to such a base material can be reduced.

The thickness of the base material, which may be suitably determined depending on the purpose of use and circumstances, is generally in the range of 50 to 300 μm, preferably in the range of 60 to 100 μm. Further, for the purpose of improving adhesion with the pressure sensitive adhesive layer provided on the base material, the base material may be optionally subjected to unevenness treatment by sand blasting, solvent treatment, and the like; or to oxidation treatment such as corona discharge treatment, electron beam irradiation, plasma treatment, ozone and ultraviolet irradiation treatment, flame treatment, chromate treatment, and hot wind treatment. Further, the base material may be subjected to primer treatment.

[Pressure Sensitive Adhesive Layer]

The pressure sensitive adhesive layer is formed of a pressure sensitive adhesive and has tackiness. Examples of such a pressure sensitive adhesive which can be suitably selected and used include, but are not particularly limited to, an acrylic pressure sensitive adhesive, a rubber-based pressure sensitive adhesive, a vinyl alkyl ether-based pressure sensitive adhesive, a silicone-based pressure sensitive adhesive, a polyester-based pressure sensitive adhesive, a polyamide-based pressure sensitive adhesive, a urethane-based pressure sensitive adhesive, a fluorine-based pressure sensitive adhesive, and a styrene-diene block copolymer-based pressure sensitive adhesive. Further, an energy ray-curable pressure sensitive adhesive can also be used as a pressure sensitive adhesive. The pressure sensitive adhesive may be used alone or in combination of two or more.

Further, when the energy ray-curable pressure sensitive adhesive is used as a pressure sensitive adhesive, examples thereof which can be used include an energy ray-curable pressure sensitive adhesive of an internally provided type in which a polymer having a radically reactive carbon-carbon double bond in a polymer side chain or in a polymer main chain or main chain terminal is used as a base polymer and an energy ray-curable pressure sensitive adhesive of an addition type in which an ultraviolet curable monomer component or oligomer component is blended with a pressure sensitive adhesive.

When an energy ray-curable pressure sensitive adhesive is used, it is preferred that the energy ray-curable pressure sensitive adhesive is cured in the protective film-forming composite sheet of the present invention. In this case, the pressure sensitive adhesive layer is preferably irradiated with energy rays and cured before the pressure sensitive adhesive layer is stacked on the protective film-forming film, when the protective film-forming composite sheet is manufactured. This reduces the maximum peel forces γ and γ' to the above specific values and can further facilitate picking up of a chip from the pressure sensitive adhesive sheet together with the protective film-forming film. However, the energy ray-curable pressure sensitive adhesive may be previously cured before use, that is, before peeling the release sheet. For example, the energy ray-curable pressure sensitive adhesive may be cured after the pressure sensitive adhesive layer is stacked on the protective film-forming film.

The working-effect of the protective film-forming composite sheet of the present invention will be exhibited to a higher extent when the pressure sensitive adhesive layer comprises a non-energy ray-curable pressure sensitive adhesive or a pressure sensitive adhesive obtained by curing an energy ray-curable pressure sensitive adhesive. The reason is as follows.

In the case where the energy ray-curable pressure sensitive adhesive is used for the pressure sensitive adhesive layer without curing, the tackiness of the energy ray-curable pressure sensitive adhesive is maintained at a high level and the delamination between the protective film-forming film and the pressure sensitive adhesive layer can be prevented from occurring when the release film is peeled from the protective film-forming composite sheet. Then, the energy ray-curable pressure sensitive adhesive can be irradiated with energy rays by the time when a chip having a protective film-forming film is picked up to thereby reduce the tackiness of the energy ray-curable pressure sensitive adhesive and also improve the pickup suitability. On the other hand, such a means cannot be employed in the case where the pressure sensitive adhesive layer comprises a non-energy ray-curable pressure sensitive adhesive or a pressure sensitive adhesive obtained by curing the energy ray-curable pressure sensitive adhesive. Therefore, it is difficult to achieve both pickup suitability and prevention of the delamination between the protective film-forming film and the pressure sensitive adhesive layer.

Note that the non-energy ray-curable pressure sensitive adhesive refers to a pressure sensitive adhesive which does not undergo curing even when irradiated with energy rays, specifically to a pressure sensitive adhesive which contains neither an energy ray-curable pressure sensitive adhesive of an internally provided type nor an ultraviolet ray (energy ray) curable compound (a monomer component and/or an oligomer component).

It is more preferred to use a pressure sensitive adhesive obtained by curing an energy ray-curable pressure sensitive adhesive among a non-energy ray-curable pressure sensitive adhesive and a pressure sensitive adhesive obtained by curing an energy ray-curable pressure sensitive adhesive in that the maximum peel force γ' after curing can be sufficiently reduced.

The thickness of the pressure sensitive adhesive layer is generally 1 to 100 μm, preferably 1 to 60 μm, more preferably 1 to 30 μm.

<Acrylic Polymer (A)>

In the present invention, an acrylic pressure sensitive adhesive can be suitably used as a pressure sensitive adhesive. Examples of the acrylic pressure sensitive adhesive include an acrylic pressure sensitive adhesive in which an acrylic polymer (A) is used as a base polymer. The weight average molecular weight (Mw) of the acrylic polymer (A) is preferably 10,000 to 2,000,000, more preferably 100,000 to 1,500,000. The weight average molecular weight of the acrylic polymer (A) is a value in terms of polystyrene as measured by gel permeation chromatography (GPC). In the present invention, by setting the weight average molecular weight to 10,000 or more, the cohesive strength can be increased, and the residue of the pressure sensitive adhesive on the protective film-forming film during pickup can be suppressed. By setting the weight average molecular weight to 2,000,000 or less, a stable coating film of a pressure sensitive adhesive layer is obtained. Further, by setting the weight average molecular weight to the above range, proper tackiness can be imparted to the pressure sensitive adhesive layer while increasing cohesive strength, and there is an advantage of easily bringing the minimum peel force β and the maximum peel forces γ and γ' described above into the specific values described above.

Further, the glass transition temperature (Tg) of the acrylic polymer (A) is preferably in the range of −70 to 30° C., more preferably −60 to 20° C. By setting the glass transition temperature (Tg) to the above range, proper tackiness can be imparted to the pressure sensitive adhesive layer while increasing cohesive strength, and there is an advantage of easily bringing the minimum peel force β and the maximum peel forces γ and γ' described above into the specific values described above.

The acrylic polymer (A) is a polymer which includes at least a (meth)acrylate monomer in constituent monomers, and the acrylic polymer (A) preferably has a functional group (hereinafter also referred to as a "reactive functional group") which reacts with a functional group of a cross-linking agent (B) to be described below.

Specific examples of (meth)acrylate monomers include alkyl (meth)acrylates having an alkyl group having 1 to 18 carbon atoms such as methyl (meth)acrylate, ethyl (meth) acrylate, propyl (meth)acrylate, butyl (meth)acrylate, pentyl (meth)acrylate, 2-ethylhexyl (meth)acrylate, isooctyl (meth) acrylate, n-octyl (meth)acrylate, n-nonyl (meth)acrylate, isononyl (meth)acrylate, decyl (meth)acrylate, and lauryl (meth)acrylate; (meth)acrylates having a cyclic skeleton such as cycloalkyl (meth)acrylate having a cycloalkyl group having 1 to about 18 carbon atoms, benzyl (meth)acrylate, isobornyl (meth)acrylate, dicyclopentanyl (meth)acrylate, dicyclopentenyl (meth)acrylate, dicyclopentenyloxyethyl (meth)acrylate, and imide (meth)acrylate; hydroxy group-containing (meth)acrylates such as hydroxymethyl (meth) acrylate, 2-hydroxyethyl (meth)acrylate, and 2-hydroxypropyl (meth)acrylate; and epoxy group-containing (meth) acrylates such as glycidyl (meth)acrylate, β-methylglycidyl (meth)acrylate, (3,4-epoxycyclohexyl)methyl (meth)acrylate, and 3-epoxycyclo-2-hydroxypropyl (meth)acrylate.

Further, monomers other than (meth)acrylate monomers, such as acrylic acid, methacrylic acid, itaconic acid, vinyl acetate, acrylonitrile, styrene, and N-methylolacrylamide, may be copolymerized. These monomers may be used singly or in combination of two or more.

Since the acrylic polymer (A) contains a reactive functional group, the acrylic polymer (A) can react with a functional group of a cross-linking agent (B) to be described below to form a three-dimensional network structure to increase the cohesiveness of a pressure sensitive adhesive layer, thereby easily bringing the maximum peel forces γ and γ' into the specific values described above. Examples of the reactive functional group of the acrylic polymer (A) include a carboxyl group, an amino group, an epoxy group, and a hydroxy group. The acrylic polymer (A) preferably contains a hydroxy group because the hydroxy group is easily allowed to selectively react with an organic multivalent isocyanate compound which is preferably used as a cross-linking agent as will be described below.

The reactive functional group can be introduced into the acrylic polymer (A) by forming the acrylic polymer (A) using a monomer having a reactive functional group such as the hydroxy group-containing (meth)acrylate and acrylic acid described above.

A monomer having a reactive functional group (hereinafter, also referred to as a reacting group-containing monomer) is preferably included in an amount of 0.3 to 40% by mass, more preferably 0.5 to 20% by mass, in all the constituent monomers of the acrylic polymer (A). By including a reacting group-containing monomer in this range, proper tackiness can be imparted to the pressure sensitive adhesive layer while increasing cohesive strength, and the minimum peel force β and the maximum peel forces γ and γ' are easily brought into the above-described specific values, as described above.

Further, the acrylic polymer (A) preferably contains the above-described alkyl (meth)acrylate as a constituent monomer, more preferably an alkyl (meth)acrylate having an alkyl group having 1 to 10 carbon atoms, particularly preferably an alkyl (meth)acrylate having an alkyl group having 4 to 8 carbon atoms, and the content thereof is preferably 30 to 99.7% by mass, more preferably 35 to 99% by mass, in all the constituent monomers.

Thus, when an alkyl (meth)acrylate is contained in a predetermined amount, proper tackiness can be imparted to the pressure sensitive adhesive layer while increasing cohesive strength, and the minimum peel force β and the maximum peel forces γ and γ' described above are easily brought into the specific values described above.

When an acrylic pressure sensitive adhesive is used as an energy ray-curable pressure sensitive adhesive of an internally provided type, examples of the acrylic polymer (A) include a polymer obtained by copolymerizing a reaction product with other monomers, the reaction product being obtained by previously reacting a monomer having a reactive functional group such as a hydroxy group-containing (meth)acrylate with a compound (hereinafter, referred to as an unsaturated group-containing compound) containing a reacting group that reacts with the reactive functional group and a carbon-carbon double bond. Further, the acrylic polymer (A) may be a polymer obtained by polymerizing an acrylic polymer from constituent monomers including a reacting group-containing monomer and then allowing a reactive functional group derived from the reacting group-containing monomer to react with an unsaturated group-containing compound. Examples of the reacting group contained in the unsaturated group-containing compound include an isocyanate group. Further, specific examples of the unsaturated group-containing compound include 2-isocyanatoethyl (meth)acrylate and isocyanatopropyl (meth) acrylate.

In the present invention, the peel forces β, γ, and γ' described above can be adjusted by suitably changing the constituent monomers of the acrylic polymer (A). For example, when an alkyl (meth)acrylate having an alkyl group having 1 to about 2 carbon atoms, vinyl acetate, or the like is blended, the values of peel forces β, γ, and γ' will be easily reduced.

Further, when the amount of the reacting group-containing monomer is increased with the cross-linking agent (B) to be described below, the values of peel forces β, γ, and γ' will be easily decreased, and when the amount of the reacting group-containing monomer is decreased with the amount of the cross-linking agent (B), the values of peel forces β, γ, and γ' tend to be easily increased.

<Cross-Linking Agent (B)>

A cross-linking agent (B) is preferably blended with a pressure sensitive adhesive composition for obtaining a pressure sensitive adhesive layer in addition to an acrylic polymer (A). For example, when the acrylic polymer (A) is used as a base polymer of a pressure sensitive adhesive, examples of the cross-linking agent (B) include an organic polyvalent isocyanate compound, an organic polyvalent epoxy compound, an organic polyvalent imine compound, and a metal chelate-based cross-linking agent, and an organic polyvalent isocyanate compound is preferred in terms of high reactivity.

Examples of the organic polyvalent isocyanate compound include an aromatic polyvalent isocyanate compound, an aliphatic polyvalent isocyanate compound, an alicyclic polyvalent isocyanate compound, and a trimer, an isocyanurate form, and an adduct form (a reaction product with a low-molecular active hydrogen-containing compound such as ethylene glycol, propylene glycol, neopentyl glycol, trimethylolpropane, and castor oil, for example, xylylene diisocyanate-trimethylolpropane adduct) of these organic polyvalent isocyanate compounds, and a terminal isocyanate urethane prepolymer obtained by reacting an organic polyvalent isocyanate compound with a polyol compound.

More specific examples of the organic polyvalent isocyanate compound include 2,4-tolylene diisocyanate, 2,6-tolylene diisocyanate, 1,3-xylylene diisocyanate, 1,4-xylene diisocyanate, diphenylmethane-4,4'-diisocyanate, diphenylmethane-2,4'-diisocyanate, 3-methyldiphenylmethane diisocyanate, hexamethylene diisocyanate, isophorone diisocyanate, dicyclohexylmethane-4,4'-diisocyanate, dicyclohexylmethane-2,4'-diisocyanate, lysine isocyanate, and the above-described derivatives obtained from these isocyanate compounds.

Specific examples of the organic polyvalent epoxy compound include 1,3-bis(N,N'-diglycidylaminomethyl)cyclohexane, N,N,N',N'-tetraglycidyl-m-xylylenediamine, ethylene glycol diglycidyl ether, 1,6-hexanediol diglycidyl ether, trimethylolpropane diglycidyl ether, diglycidyl aniline, and diglycidyl amine.

Specific examples of the organic polyvalent imine compound include N,N'-diphenylmethane-4,4'-bis(1-aziridinecarboxamide), trimethylolpropane-tri-β-aziridinyl propionate, tetramethylolmethane-tri-β-aziridinyl propionate, and N,N'-toluene-2,4-bis(1-aziridinecarboxamide)triethylenemelamine.

Specific examples of the metal chelate-based cross-linking agent include zirconium chelate-based cross-linking agents such as tri-n-butoxy ethyl acetoacetate zirconium, di-n-butoxy bis(ethyl acetoacetate) zirconium, n-butoxy tris (ethyl acetoacetate) zirconium, tetrakis(n-propyl acetoacetate) zirconium, tetrakis(acetylacetoacetate) zirconium, and tetrakis(ethyl acetoacetate) zirconium; titanium chelate-based cross-linking agents such as diisopropoxy-bis(ethyl acetoacetate) titanium, diisopropoxy-bis(acetyl acetate) titanium, and diisopropoxy-bis(acetylacetone) titanium; aluminum chelate-based cross-linking agents such as diisopropoxy ethyl acetoacetate aluminum, diisopropoxy acetylacetonato aluminum, isopropoxy bis(ethyl acetoacetate) aluminum, isopropoxy bis(acetylacetonato) aluminum, tris(ethyl acetoacetate) aluminum, tris(acetylacetonato) aluminum, and monoacetyl acetonate-bis(ethyl acetoacetate) aluminum.

As the cross-linking agent (B), the cross-linking agents listed above may be used singly or in combination of two or more. In the present invention, the peel forces β, γ, and γ' described above can be adjusted by suitably adjusting the amount of the cross-linking agent (B). For example, when the amount of the cross-linking agent (B) is increased, the values of peel forces β, γ, and γ' will be easily decreased, and when the amount of the cross-linking agent (B) is decreased, the values of peel forces β, γ, and γ' will be easily increased.

Specifically, the cross-linking agent (B) is preferably blended in an amount of 0.3 to 45 parts by mass, more preferably 0.5 to 35 parts by mass, particularly preferably 3 to 15 parts by mass, based on 100 parts by mass of the acrylic polymer (A). The values of peel forces β, γ, and γ' are easily brought into the specific values as described above by setting the amount of the cross-linking agent blended to the above range. Further, by setting the amount of the cross-linking agent to 3 to 15 parts by mass, the peel force difference between the minimum peel force β and the maximum peel force γ, and the peel force difference between the peel force γ before curing and the peel force γ' after curing, can also be decreased.

Note that, in the present invention, the pressure sensitive adhesive layer may be a single layer or a plurality of layers.

Also when a plurality of pressure sensitive adhesive layers are provided, the formulation of the pressure sensitive adhesive layer which is in contact with a protective film-forming film is suitably adjusted so that the above-described peel forces β, γ, and γ' may be suitable values.

On the other hand, the formulation of a pressure sensitive adhesive layer provided on the base material side which is not brought into contact with the protective film-forming film may be adjusted, for example, so as to increase the close contact with the base material. Further, the formulation may be adjusted so as to increase the adhesive strength to a ring frame to be described below and so as to be excellent in the removability to a ring frame.

For example, when the pressure sensitive adhesive layer has a first pressure sensitive adhesive layer provided on the base material side and a second pressure sensitive adhesive layer which is in contact with a protective film-forming film, the part by mass of the cross-linking agent (B) based on 100 parts by mass of the acrylic polymer (A) in the first pressure sensitive adhesive layer is preferably smaller than the part by mass of the cross-linking agent (B) based on 100 parts by mass of the acrylic polymer (A) in the second pressure sensitive adhesive layer.

Further, the pressure sensitive adhesive composition may be blended with a dye, a pigment, an antidegradant, an antistatic agent, a flame retardant, a silicone compound, a chain transfer agent, a plasticizer, a photopolymerization initiator, and the like as other components.

[Protective Film-Forming Film]

The protective film-forming film is laminated on a pressure sensitive adhesive layer in the form of a film.

The thickness of the protective film-forming film is preferably 3 to 300 μm, more preferably 5 to 250 μm, further preferably 7 to 200 μm, but is not particularly limited thereto.

The protective film-forming film is preferably formed from a protective film-forming composition comprising a binder resin (a) and a heat-curable component, and the protective film-forming composition may further optionally comprise other components in order to improve various physical properties. Hereinafter, each of these components will be specifically described.

<Binder Resin (a)>

The binder resin (a) is a polymer compound having the main purposes of exhibiting the film formability thereof, allowing a protective film-forming film to maintain a sheet shape, and providing flexibility to the protective film-forming film. Examples of the binder resin (a) which can be used include an acrylic resin, a polyester resin, a urethane resin, an acryl urethane resin, a silicone resin, a rubber-based polymer, and a phenoxy resin, in which an acrylic resin comprising an acrylic polymer (a1) is preferably used.

<Acrylic Polymer (a1)>

A monomer illustrated as the monomer forming the acrylic polymer (A) of the pressure sensitive adhesive layer can be used as a monomer forming the acrylic polymer (a1).

The weight average molecular weight (Mw) of the acrylic polymer (a1) is preferably 10,000 to 2,000,000, more preferably 100,000 to 1,500,000. When the weight average molecular weight of the acrylic polymer (a1) is set to the above lower limit or more, the maximum peel forces γ and γ' will not be excessively large, and the pickup failure of a chip will hardly occur. When the weight average molecular weight of the acrylic polymer (a1) is set to the above upper limit or less, the followability of the protective film-forming film to an adherend can be improved.

The glass transition temperature (Tg) of the acrylic polymer (a1) is preferably −60 to 70° C., more preferably −30 to 50° C. When the Tg of the acrylic polymer (a1) is set to the above lower limit or more, the maximum peel forces γ and γ' can be decreased, and the pickup failure can be prevented from occurring. Further, when the Tg of the acrylic polymer (a1) is set to the above upper limit or less, the adhesive strength to a wafer can be improved.

The acrylic polymer (a1) preferably contains a monomer having a reactive functional group, and the content thereof is preferably 0.3 to 50% by mass, more preferably 1 to 40% by mass, in all the constituent monomers of the acrylic polymer (a1).

A vinyl group, a (meth)acryloyl group, an amino group, a hydroxy group, a carboxyl group, an isocyanate group, an epoxy group, and the like may be used as a reactive functional group, and an epoxy group is preferred in that when the epoxy resin is used as a heat-curable resin (b) to be described below, suitable compatibility with the epoxy resin can be imparted to the acrylic polymer (a1).

Further, the acrylic polymer (a1) preferably contains an alkyl (meth)acrylate as a constituent monomer, more preferably an alkyl (meth)acrylate having an alkyl group having 1 to 10 carbon atoms, particularly preferably an alkyl (meth)acrylate having an alkyl group having 4 to 8 carbon atoms, and the content thereof is preferably 30 to 99.7% by mass, more preferably 35 to 99% by mass, in all the constituent monomers.

Note that the binder resin (a) is present in a proportion of generally 10 to 80% by mass, preferably 15 to 50% by mass, based on the total mass (in terms of solids) of the protective film-forming film.

<Heat-Curable Component>

A heat-curable component is a component for forming a hard protective film on a semiconductor chip by curing, and generally comprises a heat-curable resin (b) and a heat-curing agent (c) for heat-curing the heat-curable resin (b).

<Heat-Curable Resin (b)>

Examples of the heat-curable resin (b) include an epoxy resin, a phenolic resin, an amino resin, an unsaturated polyester resin, a polyurethane resin, a silicone resin, and a heat-curable polyimide resin. One heat-curable resin may be used alone or in combination of two or more. An epoxy resin containing low level of ionic impurities that corrode semiconductor devices is suitable as a heat-curable resin.

A conventionally known epoxy resin can be used as the epoxy resin used in the heat-curable resin (b), and specific examples include epoxy compounds having two or more functional groups per molecule such as a multifunctional epoxy resin, a biphenyl compound, bisphenol A diglycidyl ether and a hydrogenated product thereof, an ortho-cresol novolac epoxy resin, a dicyclopentadiene-type epoxy resin, a biphenyl-type epoxy resin, a bisphenol A-type epoxy resin, a bisphenol F-type epoxy resin, and a phenylene skeleton-type epoxy resin. These may be used singly or in combination of two or more.

Further, an epoxy resin having an unsaturated hydrocarbon group may be used. Examples of the epoxy resin having an unsaturated hydrocarbon group include a compound in which a part of the epoxy resin of a multifunctional epoxy resin is converted to a group containing an unsaturated hydrocarbon group. Such a compound can be synthesized, for example, by performing addition reaction of acrylic acid to the epoxy group. A compound in which a group containing an unsaturated hydrocarbon group is directly bonded to an aromatic ring constituting the epoxy resin and the like is also included. The unsaturated hydrocarbon group is an unsaturated group having polymerizability, and specific examples include a vinyl group, an allyl group, an acryloyl group, a methacryloyl group, an acrylamide group, and a methacrylamide group. Preferred examples include an acryloyl group.

The epoxy resin having an unsaturated hydrocarbon group has high compatibility with an acrylic resin as compared with an epoxy resin which does not have an unsaturated hydrocarbon group. Therefore, the reliability of a semiconductor chip is improved by using a protective film-forming film comprising the epoxy resin having an unsaturated hydrocarbon group.

The number average molecular weight of the epoxy resin is, but not particularly limited to, preferably 300 to 30000, more preferably 400 to 10000, particularly preferably 500 to 3000 from the point of view of the curability of an adhesive and the strength and heat resistance after curing. The epoxy equivalent of the epoxy resin is preferably 100 to 1000 g/eq, more preferably 300 to 800 g/eq.

<Heat-Curing Agent (c)>

When a heat-curable resin is an epoxy resin, a compound having, per molecule, two or more functional groups that can react with an epoxy group is used as a heat-curing agent (c). Examples of the functional groups include a phenolic hydroxyl group, an alcoholic hydroxyl group, an amino group, a carboxyl group, and an acid anhydride. Among these functional groups, a phenolic hydroxyl group, an amino group, and an acid anhydride are preferred; a phenolic hydroxyl group and an amino group are more preferred; and a phenolic hydroxyl group is particularly preferred.

Specific examples of phenolic curing agents having a phenolic hydroxyl group include a multifunctional phenolic resin, biphenol, a novolac-type phenolic resin, a dicyclopentadiene-based phenolic resin, and an aralkyl phenolic resin. Specific examples of amine-based curing agents include DICY (dicyandiamide). These may be used singly or in combination of two or more.

Further, a heat-curing agent having an unsaturated hydrocarbon group may be used. Examples of the heat-curing agent having an unsaturated hydrocarbon group include a compound in which a part of hydroxy groups of a phenolic resin is replaced by a group containing an unsaturated hydrocarbon group and a compound in which a group containing an unsaturated hydrocarbon group is directly bonded to an aromatic ring of a phenolic resin. The unsaturated hydrocarbon group is the same as illustrated in the epoxy resin having an unsaturated hydrocarbon group described above.

The molecular weight of the heat-curing agent is preferably 60 to 30000, more preferably 70 to 10000, further preferably 80 to 3000.

The content of the heat-curing agent (c) in the protective film-forming film is preferably 0.1 to 500 parts by mass, more preferably 1 to 200 parts by mass, based on 100 parts by mass of the heat-curable resin (b). The curability of the protective film-forming film is improved by setting the content of the heat-curing agent to the above lower limit or more.

In the protective film-forming film, the total amount of the heat-curable resin (b) and the heat-curing agent (c) (heat-curable components) is preferably 20 to 200 parts by mass, more preferably 40 to 160 parts by mass, further preferably 70 to 130 parts by mass, based on 100 parts by mass of the binder resin (a).

<Curing Accelerator (d)>

A curing accelerator (d) may be blended with a protective film-forming composition for forming a protective film-forming film. The curing accelerator (d) is used to adjust the cure rate of the protective film-forming film. Examples of preferred curing accelerators include tertiary amines such as triethylenediamine, benzyldimethylamine, triethanolamine, dimethylaminoethanol, and tris(dimethylaminomethyl)phenol; imidazoles such as 2-methylimidazole, 2-phenylimidazole, 2-phenyl-4-methylimidazole, 2-phenyl-4,5-dihydroxymethylimidazole, and 2-phenyl-4-methyl-5-hydroxymethylimidazole; organic phosphines such as tributylphosphine, diphenylphosphine, and triphenylphosphine; and tetraphenyl boron salts such as tetraphenylphosphonium tetraphenylborate and triphenylphosphine tetraphenylborate. These curing accelerators may be used singly or in combination of two or more.

The curing accelerator (d) is present in an amount of preferably 0.01 to 10 parts by mass, more preferably 0.1 to 3 parts by mass, based on 100 parts by mass of the sum of the heat-curable component. When the protective film-forming film comprises the curing accelerator (d) in an amount in the above range, the protective film-forming film will have excellent adhesive properties even when exposed to high temperature and high humidity, and will have excellent protection performance.

<Coloring Agent (e)>

A coloring agent (e) may be blended with a protective film-forming composition for forming a protective film-forming film. The protective film-forming film preferably comprises a coloring agent (e) so that the film can prevent malfunction of a semiconductor chip by shielding the infrared rays or the like generated from the surrounding apparatus when the semiconductor chip is incorporated into equipment. Further, when the protective film-forming film comprises the coloring agent (e), the discrimination of characters when a product number, a mark, and the like are printed on a protective film obtained by curing the protective film-forming film can be improved. That is, a lot number and the like is generally printed by a laser marking method on the backside of the semiconductor chip on which the protective film is formed, and the contrast difference between a printed portion and a non-printed portion is increased to improve the discrimination when the protective film comprises the coloring agent (e).

An organic or inorganic pigment or dye is used as the coloring agent (e). Any dye including acid dye, reactive dye, direct dye, disperse dye, and cationic dye can be used as the dye. Further, the pigment is also not particularly limited, and may be suitably selected for use from a known pigment.

Among these pigments, more preferred is a black pigment which has good shieldability of electromagnetic waves and infrared rays and can improve the discrimination by the laser marking method. Examples of the black pigment which can be used include, but are not limited to, carbon black, iron oxide, manganese dioxide, aniline black, and activated carbon. From the point of view of increasing the reliability of a semiconductor chip, carbon black is particularly preferred. One coloring agent (e) may be used alone or in combination of two or more.

The amount of the coloring agent (e) blended is preferably 0.01 to 25% by mass, more preferably 0.03 to 15% by mass, based on the total mass (in terms of solids) of the protective film-forming film.

<Coupling Agent (f)>

In order to improve adhesion and close contact of a protective film-forming film to an adherend, a coupling agent (f) having a functional group to react with an inorganic substance and a functional group to react with an organic functional group may be blended with a protective film-forming composition. Further, by using the coupling agent (f), the water resistance of a cured product obtained by curing a protective film-forming film can be improved without impairing the heat resistance thereof.

A compound having a group to react with functional groups in the binder resin (a), the heat-curable resin (b), and the like is preferably used as the coupling agent (f). A silane coupling agent is desirable as the coupling agent (f). Examples of such a coupling agent include γ-glycidoxypropyltrimetoxysilane, γ-glycidoxypropylmethyldietoxysilane, β-(3,4-epoxycyclohexyl)ethyltrimethoxysilane, γ-(methacryloxypropyl)trimethoxysilane, γ-aminopropyltrimethoxysilane, N-6-(aminoethyl)-γ-aminopropyltrimethoxysilane, N-6-(aminoethyl)-γ-aminopropylmethyldiethoxysilane, N-phenyl-γ-aminopropyltrimethoxysilane, γ-ureidopropyltriethoxysilane, γ-mercaptopropyltrimethoxysilane, γ-mercaptpropylmethyldimethoxysilane, bis(3-triethoxysilylpropyl)tetrasulfane, methyltrimethoxysilane, methyltriethoxysilane, vinyltrimethoxysilane, vinyltriacetoxysilane, and imidazole silane. These may be used singly or in combination of two or more.

When the coupling agent (f) is used, the coupling agent is present in a proportion of generally 0.1 to 20 parts by mass, preferably 0.2 to 10 parts by mass, more preferably 0.3 to 5 parts by mass, based on 100 parts by mass of the sum of the binder resin (a), the heat-curable resin (b), and the curing agent (c). If the content of the coupling agent (f) is less than 0.1 part by mass, the above effect may not be obtained, and if the content is more than 20 parts by mass, outgas may be caused.

<Filler (g)>

Further, a filler (g) may be blended with a protective film-forming composition to allow a protective film-forming film to contain the filler (g). Moisture resistance, dimensional stability, and the like can be provided to a protective film by blending the filler (g). Further, by blending the filler (g), the strength of the protective film obtained by curing a protective film-forming film can be increased to improve rubfastness, or the contrast can be enhanced when laser marking is applied to the surface of the protective film. Specific examples of the filler include inorganic fillers.

Examples of preferred inorganic fillers include a powder such as silica, alumina, talc, calcium carbonate, titanium oxide, iron oxide, silicon carbide, and boron nitride, a bead obtained by converting the powder into a spherical shape, single-crystal fiber, and glass fiber. Among these fillers, a silica filler and an alumina filler are particularly preferred. Further, the above inorganic fillers are used singly or in combination of two or more.

In order to further increase the above effect, the content of the filler (g) is generally 45 to 80% by mass, preferably 55 to 70% by mass, based on the whole protective film-forming film.

On the other hand, when the content of the filler (g) is in such a range that the content is relatively high, the delamination between a protective film-forming film and a pressure sensitive adhesive layer tends to occur. This is probably because, in the interface between the protective film-forming film and the pressure sensitive adhesive layer, the adhesion at the contact between the binder resin (a) and the pressure sensitive adhesive layer is lower than the adhesion at the contact between the filler (g) and the pressure sensitive adhesive layer. Therefore, the effect of the present invention of preventing the delamination between the pressure sensitive adhesive layer and the protective film-forming film is further exhibited in this case.

<Cross-Linking Agent (h)>

A cross-linking agent (h) may be blended with a protective film-forming composition for obtaining a protective film-forming film. When the cross-linking agent (h) is blended, a functional group of the binder resin (a) can be cross-linked through the cross-linking agent (h). The initial adhesive strength and the cohesive strength of the protective film-forming film can be adjusted by blending the cross-linking agent (h). Examples of the cross-linking agent (h) include an organic polyvalent isocyanate compound and an organic polyimine compound, and specific examples include those illustrated as a cross-linking agent (B) used in the pressure sensitive adhesive layer.

When an isocyanate-based cross-linking agent is used, it is preferred to use a hydroxy group-containing polymer as a binder resin (a) such as an acrylic polymer (a1). When the cross-linking agent has an isocyanate group and the acrylic polymer (a1) has a hydroxy group, a reaction occurs between the cross-linking agent and the acrylic polymer (a1), and a cross-linking structure can be easily introduced into a protective film-forming film.

When the cross-linking agent (h) is used, the cross-linking agent (h) is used in an amount of generally 0.01 to 20 parts by mass, preferably 0.1 to 10 parts by mass, more preferably 0.5 to 5 parts by mass, based on 100 parts by mass of the binder resin (a).

[Release Film]

A conventionally known release film can be suitably used as a release film as long as the above peel force ratio α/β can be brought into 0.50 or less. Specifically, the release film is preferably a film having a release agent layer formed on one surface of a release film base material, but is not particularly limited thereto. Examples of the release agent forming the release agent layer which can be used include a silicone-based release agent and a non-silicone-based release agent such as an alkyd resin-based release agent, an olefin resin-based release agent, an acrylic resin-based release agent, a long chain alkyl group-containing compound-based release agent, and a rubber-based release agent. Among these release agents, a silicone-based release agent is suitable.

The release agent layer can be formed by coating one surface of a release film base material with a release agent solution comprising a release agent, an optional curing agent, a diluent, and the like, and then drying and curing the coating. Note that examples of coating methods which can be used include a gravure coating method, a bar coating method, a spray coating method, a spin coating method, a knife coating method, a roll coating method, and a die coating method.

Examples of the silicone resin-based release agent include a solvent-type release agent and a solventless-type release agent. The solvent-type silicone resin is diluted with a solvent to form a coating liquid. Therefore, wide variety of polymers can be used from a polymer having high molecular weight and high viscosity to a low-molecular weight polymer (oligomer) having low viscosity. Therefore, the control of releasability is easy, and the design in accordance with required performance (quality) is easily made, as compared with the solventless-type silicone resin. Further, examples of the silicone resin-based release agent include an addition reaction-type release agent, a condensation reaction-type release agent, an ultraviolet-curable release agent, and an electron beam-curable release agent. The addition reaction-type silicone resin has high reactivity and is excellent in productivity, and has an advantage such as small change of peel force after manufacturing and no cure shrinkage as compared with a condensation reaction-type silicone resin. Therefore, the addition reaction-type silicone resin is preferably used as a release agent forming a release agent layer.

Various addition reaction-type silicone resins can be used without particular limitation. For example, those commonly used as a conventional heat-curable addition reaction-type silicone resin release agent can be used. Examples of the addition reaction-type silicone resin which can be easily heat-cured include a silicone resin having, as a functional group in a molecule, an alkenyl group such as a vinyl group or an electrophilic group such as a hydrosilyl group. A polydimethylsiloxane having such a functional group, a polydimethylsiloxane in which a part or all of the methyl groups are replaced by an aromatic functional group such as a phenyl group, and the like can be used.

To the silicone resin-based release agent, silica, a silicone resin, an antistatic agent, a dye, a pigment, and other additives may be optionally added.

In order to cure the applied coating film of the release agent, the coating film may be subjected to heat-treatment in an oven of a coater or may be subjected to ultraviolet irradiation after the heat-treatment. However, the latter case is preferred in terms of preventing the occurrence of thermal shrinkage wrinkles of a base film, the curability of silicone, and the close contact of the release agent to the base film.

Note that when the ultraviolet irradiation is used in combination to cure the coating film, a photoinitiator is desirably added to the release agent. The photoinitiator is not particularly limited, and any photoinitiator can be suitably selected for use from among those commonly used as photoinitiators which generate radicals when irradiated with ultraviolet rays or electron beams. Examples of the photoinitiator include benzoins, benzophenones, acetophenones, α-hydroxyketones, α-aminoketones, α-diketone, α-diketone dialkyl acetals, anthraquinones, and thioxanthones.

An alkyd resin having a cross-linking structure is generally used as an alkyd resin-based release agent. For forming an alkyd resin layer having a cross-linking structure, for example, a method of heat curing a layer comprising a heat-curable resin composition containing an alkyd resin, a cross-linking agent, and optionally a curing catalyst can be used. Further, the alkyd-based resin may be a modified product such as a long-chain alkyl-modified alkyd resin and a silicone-modified alkyd resin.

A crystalline olefinic resin is used as an olefin resin-based release agent. As the crystalline olefinic resin, polyethylene, crystalline polypropylene-based resin, and the like are suitable. Examples of polyethylene include high density polyethylene, low density polyethylene, and linear low density polyethylene. Examples of the crystalline polypropylene-based resin include a propylene homopolymer having an isotactic structure or a syndiotactic structure and a propylene-α olefin copolymer. These crystalline olefinic resins may be used singly or in combination of two or more.

An acrylic resin having a cross-linking structure is generally used as an acrylic release agent. The acrylic resin may be a modified product such as a long-chain alkyl-modified acrylic resin and a silicone-modified acrylic resin.

Examples of the long chain alkyl group-containing compound-based release agent which can be used include polyvinyl carbamate obtained by allowing a long-chain alkyl isocyanate having 8 to 30 carbon atoms to react with a polyvinyl alcohol-based polymer and an alkylurea derivative obtained by allowing a long-chain alkyl isocyanate having 8 to 30 carbon atoms to react with polyethyleneimine.

Examples of the rubber-based release agent include a natural rubber-based resin and a synthetic rubber-based resin, such as butadiene rubber, isoprene rubber, styrene-butadiene rubber, methyl methacrylate-butadiene rubber, and acrylonitrile-butadiene rubber.

The thickness of the release agent layer is, but not particularly limited to, preferably 0.01 to 1 μm, more preferably 0.03 to 0.5 μm.

Examples of the release film base material include, but are not particularly limited to, a film comprising a plastic such as polyester such as polyethylene terephthalate and polyethylene naphthalate, polyolefin such as polypropylene and polymethylpentene, polycarbonate, and polyvinyl acetate. The release film base material may be a single layer or may be a multilayer composed of two or more same or different layers. Among these films, a polyester film is preferred; a polyethylene terephthalate film is particularly preferred; and a biaxially stretched polyethylene terephthalate film is further preferred.

[Specific Structure of Protective Film-Forming Composite Sheet]

Hereinafter, a specific structure of a protective film-forming composite sheet will be described in detail.

In the present invention, the protective film-forming film has, for example, the same shape as that of a semiconductor wafer (hereinafter, simply referred to as a "wafer") which is an adherend or a larger shape than that of a wafer, and is preferably formed into a circle. The pressure sensitive adhesive layer is formed, for example, slightly larger than the protective film-forming film, and the peripheral part of the pressure sensitive adhesive layer has a region where the protective film-forming film is not laminated (peripheral region). Thus, when the pressure sensitive adhesive layer is slightly larger, the peripheral part of the pressure sensitive adhesive layer will be a region to be bonded to a ring frame when the protective film-forming composite sheet is fixed to the ring frame, as will be described below.

Note that the peripheral part of the pressure sensitive adhesive layer may be provided with a removable pressure sensitive adhesive layer so as to surround the protective film-forming film. In this case, the protective film-forming composite sheet will be fixed to the ring frame through the removable pressure sensitive adhesive layer.

The removable pressure sensitive adhesive layer is formed with a known removable pressure sensitive adhesive. The removable pressure sensitive adhesive is not particularly limited as long as a paste residue is not produced on a ring frame when the removable pressure sensitive adhesive is removed from the ring frame after it is bonded to the ring frame. Specifically, an acrylic pressure sensitive adhesive, a rubber-based pressure sensitive adhesive, a silicone-based pressure sensitive adhesive, and the like can be used. Further, the removable pressure sensitive adhesive layer is generally annular, but the layer may have a shape in which a part of the ring is missing, such as the shape of C. The removable pressure sensitive adhesive layer may be a single layer or may be composed of a plurality of layers.

Further, in the present invention, when the pressure sensitive adhesive layer is formed of a plurality of layers, the pressure sensitive adhesive layer on the side of the base material is preferably formed slightly larger than the pressure sensitive adhesive layer in contact with the protective film-forming film. In this case, the peripheral part of the pressure sensitive adhesive layer on the side of the base material is a region to be bonded to a ring frame.

[Method of Using Protective Film-Forming Composite Sheet]

The protective film-forming composite sheet of the present invention is used, for example, as follows.

In the present invention, a release film is first peeled from a protective film-forming composite sheet, and the peripheral part of the protective film-forming composite sheet is bonded to a ring frame. Here, when a removable pressure sensitive adhesive layer is provided, the removable pressure sensitive adhesive layer is bonded to the ring frame, but when there is no removable pressure sensitive adhesive layer, a pressure sensitive adhesive layer is directly bonded to the ring frame.

Subsequently, a wafer which is an adherend is bonded to the center portion of the protective film-forming film of the protective film-forming composite sheet fixed to the ring frame. Next, a laminate of the wafer and the protective film-forming film is integrally diced and singulated as a semiconductor chip having a protective film-forming film. The singulated semiconductor chip is picked up by general-purpose means, such as a collet.

Here, the protective film-forming film is heat-cured to thereby form a protective film. The protective film-forming film can be generally picked up and then heat-cured to thereby obtain a semiconductor chip having a protective film on the back surface thereof (chip having a protective film). However, in the present invention, the protective film-forming film may be heat-cured before it is picked up.

A semiconductor device can be manufactured by mounting the chip having a protective film obtained as described above on a substrate or the like by a facedown method. Further, a semiconductor device can also be manufactured by allowing the chip having a protective film to adhere to another member (to a chip mounting part) such as a die pad part or a different semiconductor chip.

[Specific Examples of Protective Film-Forming Composite Sheet]

Next, specific examples of the protective film-forming composite sheet and methods for using the same will be described using FIGS. 2 to 7.

Figure 2:
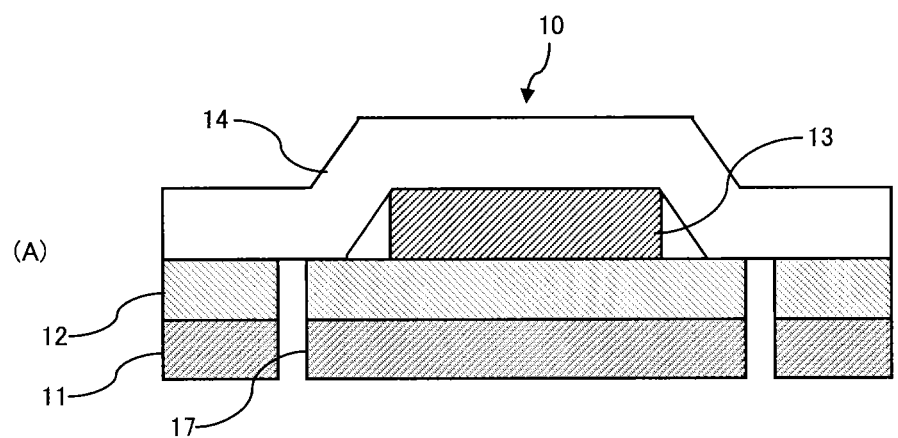
FIG. 2 shows a sectional view (A) and a plan view (B) showing a specific example of the protective film-forming composite sheet of the present invention.
Figure 2:
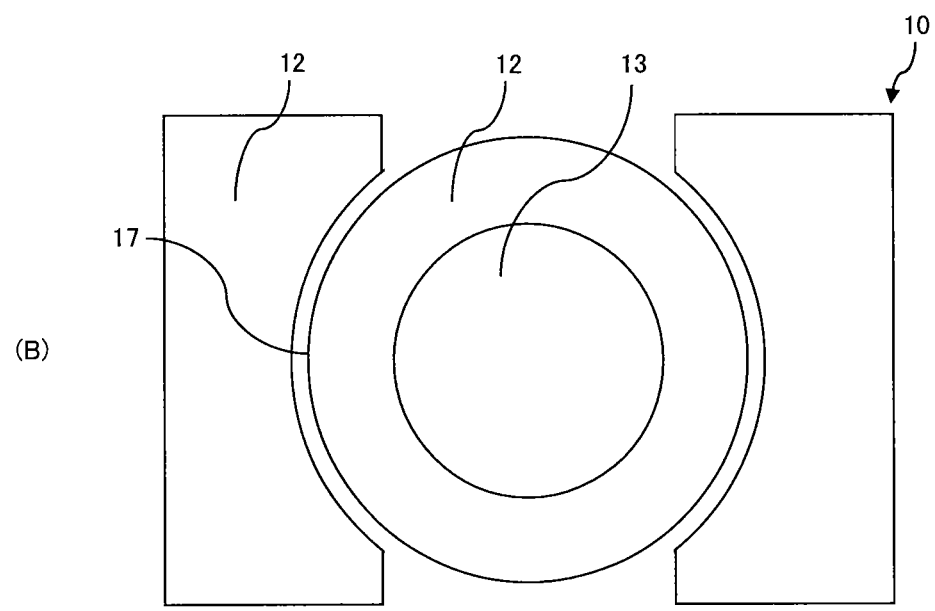

In FIG. 2, a pressure sensitive adhesive layer 12 is provided on a base material 11, and an annular cut 17 is made so as to divide a pressure sensitive adhesive sheet 16 consisting of the base material 11 and the pressure sensitive adhesive layer 12. The inside of the cut 17 forms a protective film-forming composite sheet 10 of the present invention. The outside of the cut 17 is a waste part. On the pressure sensitive adhesive layer 12 of the protective film-forming composite sheet 10, a protective film-forming film 13 slightly smaller than the pressure sensitive adhesive layer 12 is provided, and the peripheral part of the pressure sensitive adhesive layer 12 is a region in which the protective film-forming film is not provided. A release sheet 14 provided on the protective film-forming film 13 is bonded to both the pressure sensitive adhesive layer 12 and the protective film-forming film 13.

Figure 3:
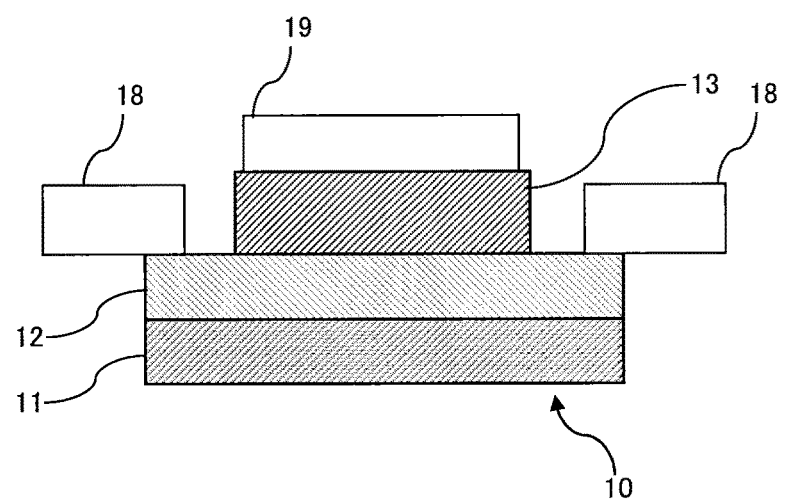
FIG. 3 is a sectional view showing an example of the conditions of use of the protective film-forming composite sheet of the present invention.

The release film 14 is peeled and removed from the protective film-forming composite sheet 10 together with the above waste part. Then, the peripheral part of the pressure sensitive adhesive layer 12 is bonded to a ring frame 18, thereby fixed to the ring frame 18, as shown in FIG. 3. A wafer 19 is bonded to the protective film-forming film 13, and then the protective film-forming composite sheet 10 fixed to the ring frame 18 is subjected to the above-described dicing and pickup steps.

Figure 4:
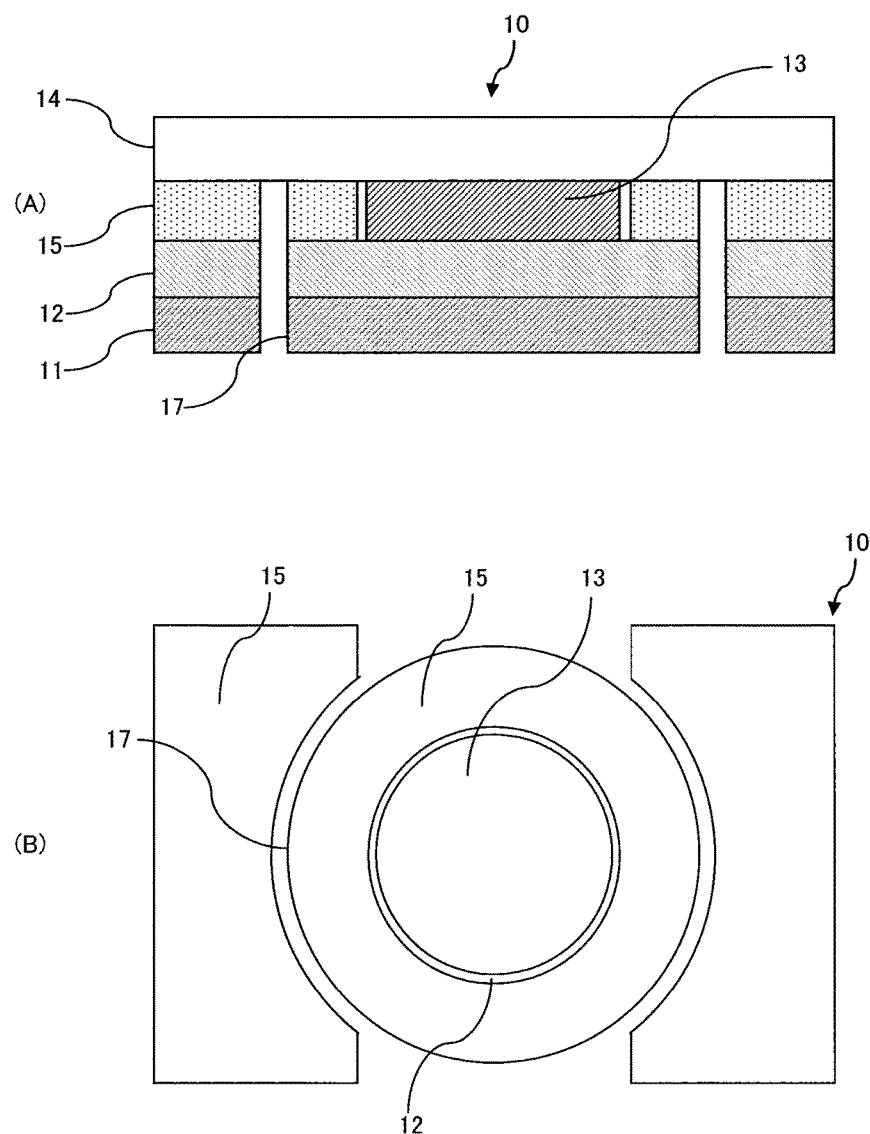
FIG. 4 shows a sectional view (A) and a plan view (B) showing a specific example of the protective film-forming composite sheet of the present invention.
Figure 5:
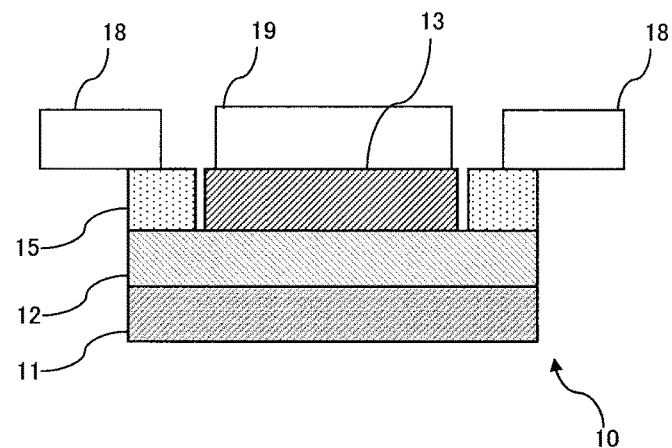
FIG. 5 is a sectional view showing an example of the conditions of use of the protective film-forming composite sheet of the present invention.

The protective film-forming composite sheet 10 shown in FIG. 4 is different from the structure of FIG. 1 in that a removable pressure sensitive adhesive layer 15 is bonded on the upper surface of the pressure sensitive adhesive layer 12 in which the protective film-forming film 13 is not provided, and the release film 14 is bonded to the protective film-forming film 13 and the removable pressure sensitive adhesive layer 15. Further, the cut 17 divides not only the base material 11 and the pressure sensitive adhesive layer 12 but also the removable pressure sensitive adhesive layer 15, and in the inside of the cut 17 forming the protective film-forming composite sheet 10 of the present invention, the removable pressure sensitive adhesive layer 15 surrounds the protective film-forming film 13 in an annular shape. In this protective film-forming composite sheet 10, the removable pressure sensitive adhesive layer 15 is bonded to the ring frame 18, thereby being fixed to the ring frame 18, as shown in FIG. 5.

Figure 6:
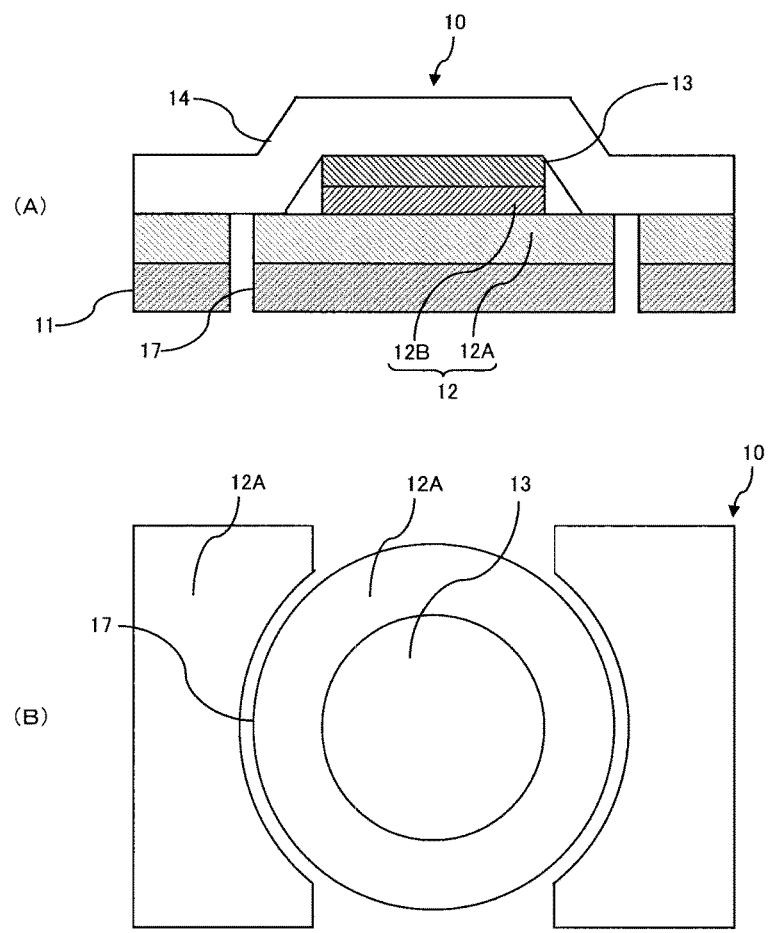
FIG. 6 shows a sectional view (A) and a plan view (B) showing a specific example of the protective film-forming composite sheet of the present invention.

In FIG. 6, a first pressure sensitive adhesive layer 12A is provided on the base material 11 and the annular cut 17 is provided so as to divide the base material 11 and the first pressure sensitive adhesive layer 12A, and the inside of the cut 17 forms the protective film-forming composite sheet 10 of the present invention. The outside of the cut 17 is a waste part. A second pressure sensitive adhesive layer 12B and the protective film-forming film 13 which are slightly smaller than the first pressure sensitive adhesive layer 12A are provided in this order on the first pressure sensitive adhesive layer 12A of the protective film-forming composite sheet 10, and the peripheral part of the first pressure sensitive adhesive layer 12A is a region in which the protective film-forming film is not provided. The release sheet 14 provided on the protective film-forming film 13 is bonded to both the protective film-forming film 13 and the first pressure sensitive adhesive layer 12A.

Figure 7:
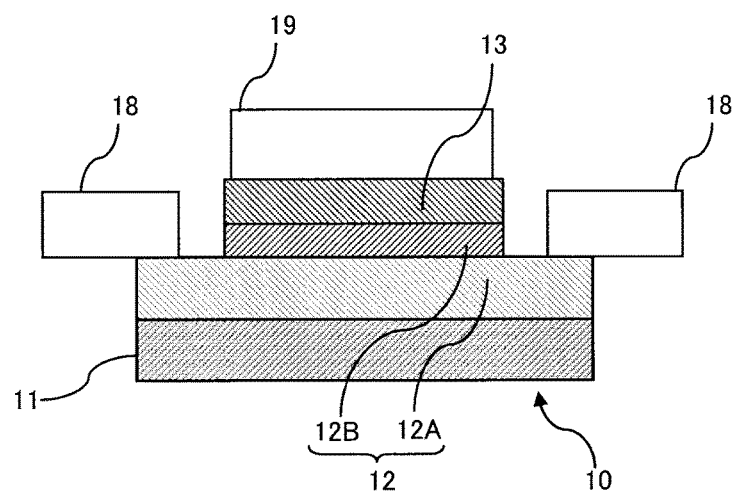
FIG. 7 is a sectional view showing an example of the conditions of use of the protective film-forming composite sheet of the present invention.

In this protective film-forming composite sheet 10, the peripheral part of the first pressure sensitive adhesive layer 12A is bonded to the ring frame 18 to be fixed to the ring frame 18, as shown in FIG. 7.

[Method for Manufacturing Protective Film-Forming Composite Sheet]

Hereinafter, a method for manufacturing a protective film-forming composite sheet will be described.

<Preparation of Protective Film-Forming Film Supported on Release Films>

A release film is coated with a protective film-forming composition prepared by mixing a suitable proportion of each component forming the above protective film-forming film in a suitable solvent or in a solvent-free condition, and then the coating is dried to form a protective film-forming film on the release film. Next, a release film is further bonded to the protective film-forming film to obtain a protective film-forming film supported on release films composed of a three-layer structure of release film/protective film-forming film/release film. The protective film-forming film supported on release films is suitably wound, and may be stored and carried as a winding body. Note that in the above steps, the step of laminating a release film may be omitted, allowing the protective film-forming film to be left exposed.

<Preparation of Pressure Sensitive Adhesive Sheet>

A release film is coated with a pressure sensitive adhesive composition prepared by mixing a suitable proportion of each component forming a pressure sensitive adhesive layer in a suitable solvent or in a solvent-free condition, and then the coating is dried to form a pressure sensitive adhesive layer on the release film. Then, a base material is bonded to the pressure sensitive adhesive layer to thereby obtain a pressure sensitive adhesive sheet having a release film. The pressure sensitive adhesive sheet having a release film is suitably wound, and may be stored and carried as a winding body.

Alternatively, instead of coating a release film with a pressure sensitive adhesive composition, a base material may be directly coated with a pressure sensitive adhesive composition to form a pressure sensitive adhesive layer, and then a release film may be further bonded to the pressure sensitive adhesive layer to form a pressure sensitive adhesive sheet having a release film. In this case, the step of laminating a release film may be omitted, allowing the pressure sensitive adhesive layer to be left exposed.

<Lamination>

Subsequently, one of the release films is optionally peeled from the protective film-forming film supported on release films, and a release sheet is optionally peeled from the pressure sensitive adhesive sheet having a release film. Then, the protective film-forming film can be bonded to the surface of the pressure sensitive adhesive layer of the pressure sensitive adhesive sheet to prepare a protective film-forming composite sheet.

<Die Cutting>

The above protective film-forming film supported on release films may be optionally subjected to die cutting before being bonded to a pressure sensitive adhesive sheet.

The die cutting is performed by half-cutting the above protective film-forming film supported on release films, for example, into a circular shape that is the same as or slightly larger than a wafer so as to cut one of the release films and the protective film-forming film and then removing all of one of the release films and the part of the protective film-forming film which is present outside the circular shape which has been created by half-cutting. Thereby, a release film having a protective film-forming film in which a circular and exposed protective film-forming film is formed on a release film can be obtained.

In the half-cutting, a cutting edge is generally put from the side of the release film that should be removed first. Further, the release film having a protective film-forming film is generally a long film on which many circular protective film-forming films are provided in the longitudinal direction and is, for example, wound into a winding body.

This release film having a protective film-forming film can be bonded to a pressure sensitive adhesive sheet so that the protective film-forming film side may be brought into contact with the pressure sensitive adhesive layer and then cut to thereby obtain the protective film-forming composite sheet shown in FIG. 2.

<Formation of Removable Pressure Sensitive Adhesive Layer>

First, a removable pressure sensitive adhesive layer supported on release films composed of a three-layer structure of release film/removable pressure sensitive adhesive layer/release film is prepared in the same manner as the protective film-forming film supported on release films as described above.

The removable pressure sensitive adhesive layer supported on release films is subjected to half-cutting, for example, into a circular shape that is slightly larger than a wafer so as to cut one of the release films and the removable pressure sensitive adhesive layer, and then the circular removable pressure sensitive adhesive layer and all of the process release film which have been subjected to half-cutting. Thereby, a release film having a removable pressure sensitive adhesive layer, in which a removable pressure sensitive adhesive layer having a shape from which a circular portion is cut out is laminated to the surface of one of the release films, can be obtained.

The release film having a removable pressure sensitive adhesive layer is bonded to the above release film having a protective film-forming film in which a circular and exposed protective film-forming film is formed on a release film. Subsequently, the release film, for example, on the side of the removable pressure sensitive adhesive layer can be peeled to thereby obtain a release film having, on one surface, a protective film-forming film and an annular removable pressure sensitive adhesive layer arranged outside of the protective film-forming film. This release film can be bonded to a pressure sensitive adhesive sheet so that the removable pressure sensitive adhesive layer and the protective film-forming film may be brought into contact with the pressure sensitive adhesive layer and then cut to thereby obtain, for example, the protective film-forming composite sheet shown in FIG. 4.

Note that when two or more pressure sensitive adhesive layers are provided, the second and more pressure sensitive adhesive layers may be laminated on the first pressure sensitive adhesive layer prepared as described above or may be laminated on a protective film-forming film when a protective film-forming film supported on release films is prepared. In this case, a method of laminating the second and more pressure sensitive adhesive layers may include coating a protective film-forming film with a pressure sensitive adhesive composition followed by drying. However, when the releasability between the pressure sensitive adhesive layer and the protective film-forming film during the pickup is taken into consideration, the method preferably include transferring a pressure sensitive adhesive layer formed on a release film. Note that the pressure sensitive adhesive layer laminated on the protective film-forming film may be die-cut together with protective film-forming film by die cutting.

EXAMPLES

Hereinafter, the present invention will be described further in detail with reference to Examples, but the present invention is not limited to these examples.

The measuring methods and the evaluation methods in the present invention are as follows.

<Maximum Peel Force α>

A protective film-forming composite sheet sample was cut to a size of 25 mm in width×180 mm in length; the whole surface of the sample on the base material side was fixed to an acrylic sheet (70 mm in width×150 mm in length×2 mm in thickness) with a double-sided tape; and peel force was obtained by measuring the load when a release film was peeled. The peel force was measured under conditions of a peel angle of 180 degrees, a measurement temperature of 23° C., and a peel rate of 300 mm/min. Measurement length was 100 mm, in which 10 mm at the start and 10 mm at the end of measurement were excluded from the effective value. A universal tensile testing machine (machine name "TENSILON UTM-4-100", manufactured by Orientec Co., Ltd.) was used for measurement.

The maximum value among the resulting measured values was defined as the maximum peel force α between a protective film-forming film and a release film.

<Minimum Peel Force β, Maximum Peel Force γ>

A portion of a protective film-forming composite sheet in which a protective film-forming film was formed was cut to a size of 25 mm in width×180 mm in length; a release film was peeled, and the protective film-forming film side was bonded to a silicon wafer [diameter; 15.24 cm (6 inches), thickness; 700 μm]; and peel force was obtained by measuring the load when a pressure sensitive adhesive sheet was peeled from the protective film-forming film. The peel force was measured under conditions of a peel angle of 180 degrees, a measurement temperature of 23° C., and a peel rate of 300 mm/min. Measurement length was 100 mm, in which 10 mm at the start and 10 mm at the end of measurement were excluded from the effective value. The minimum value and the maximum value among the resulting measured values were defined as the minimum peel force β and the maximum peel force γ, respectively, between a pressure sensitive adhesive sheet and a protective film-forming film.

<Peel Force Ratio α/β>

The peel force ratio α/β was calculated from the calculation formula [peel force ratio α/β=maximum peel force α/minimum peel force β] using the maximum peel force α and the minimum peel force β obtained above.

<Maximum Peel Force γ'>

A portion of a protective film-forming composite sheet in which a protective film-forming film was formed was cut to a size of 25 mm in width×180 mm in length; a release film was peeled; and the protective film-forming film side was bonded to a silicon wafer [diameter: 15.24 cm (6 inches), thickness: 700 μm]. The resulting laminate was heated at 130° C. for 2 hours to cure the protective film-forming film. Then, peel force was obtained by measuring the load when a pressure sensitive adhesive sheet was peeled from the protective film-forming film. The peel force was measured under conditions of a peel angle of 180 degrees, a measurement temperature of 23° C., and a peel rate of 300 mm/min. Measurement length was 100 mm, in which 10 mm at the start and 10 mm at the end of measurement were excluded from the effective value. The maximum value among the resulting measured values was defined as the maximum peel force γ' between a pressure sensitive adhesive sheet and a protective film-forming film.

<Protective Film-Forming Composite Sheet Lamination Test>

Using a tape mounter RAD 2700 manufactured by Lintec Corporation, a release film was peeled from each protective film-forming composite sheet, and then the resulting protective film-forming composite sheet was bonded to a wafer [diameter: 20.32 cm (8 inches), thickness: 150 μm] and a ring frame. The state of the protective film-forming composite sheet at this time was visually evaluated according to the following criteria OK and NG.

OK . . . (When 10 sheets are tested, delamination or lifting of a protective film-forming film from a pressure sensitive adhesive sheet is not observed)

NG . . . (When 10 sheets are tested, delamination or lifting of a protective film-forming film from a pressure sensitive adhesive sheet occurs in one sheet or more)

<Pickup Test>
[Before Heat Curing]

Using a tape mounter RAD 2700 manufactured by Lintec Corporation, a release film was peeled from each protective film-forming composite sheet, and then the resulting protective film-forming composite sheet was bonded to a silicon wafer [diameter: 20.32 cm (8 inches), thickness: 150 μm] and a ring frame. Then, the resulting laminate was diced (chip size: 5 mm×5 mm). The diced laminate was pushed up with a needle from the pressure sensitive adhesive sheet side, and the state of the chipping of a chip and the delamination of a protective film-forming film was visually evaluated. The test was performed on 10 sheets.

<Pickup Test>
[After Heat Curing]

Using a tape mounter RAD 2700 manufactured by Lintec Corporation, a release film was peeled from each protective film-forming composite sheet, and then the resulting protective film-forming composite sheet was bonded to a silicon wafer [diameter: 20.32 cm (8 inches), thickness: 150 μm] and a ring frame. The resulting laminate was heated at 130° C. for 2 hours to cure the protective film-forming film. Then, the resulting laminate was diced (chip size: 5 mm×5 mm). The diced laminate was pushed up with a needle from the pressure sensitive adhesive sheet side, and the state of the chipping of a chip and the delamination of a protective film-forming film was visually evaluated. The test was performed on 10 sheets.

The above pickup tests before heat curing and after heat curing were evaluated by the number of sheets in which chipping of a wafer and delamination of a protective film-forming film from a wafer were observed.

A . . . There is no sheet in which wafer chipping and film delamination were observed in both the pickup tests before heat curing and after heat curing.

B1 . . . There was no sheet in which wafer chipping and film delamination were observed in the pickup test before heat curing, but there was one sheet or two sheets in which wafer chipping and film delamination from a wafer were observed in the test after heat curing.

B2 . . . There was no sheet in which wafer chipping and film delamination were observed in the pickup test before heat curing, but there were three or more sheets in which wafer chipping and film delamination from a wafer were observed in the test after heat curing.

C1 . . . There was one sheet or two sheets in which wafer chipping and film delamination were observed in the pickup test before heat curing, but there was no sheet in which wafer chipping and film delamination were observed in the pickup test after heat curing.

C2 . . . There were three or more sheets in which wafer chipping and film delamination were observed in the pickup test before heat curing, but there was no sheet in which wafer chipping and film delamination were observed in the pickup test after heat curing, D . . . There was one or two sheets in which wafer chipping and film delamination were observed in any one of the pickup tests before heat curing and after heat curing, and there was one sheet or more in which wafer chipping and film delamination were observed in the other pickup test.

F . . . There were three or more sheets in which wafer chipping and film delamination were observed in both the pickup tests before heat curing and after heat curing.

Example 1

[Preparation of Protective Film-Forming Composition]

A methyl ethyl ketone solution (solid concentration: 50% by mass) having the following composition (mass ratio) was prepared, and the solution was used as a protective film-forming composition.

Binder resin (a)/heat-curable resin (b)/heat-curing agent (c)/
curing accelerator (d)/coloring agent (e)/
coupling agent (f)/filler (g)=
17/17/0.3/0.3/2/0.4/63

Binder resin (a): acrylic polymer (a1) (weight average molecular weight: 800,000, glass transition temperature: −28° C.) comprising, as monomers, 55% by mass of butyl acrylate, 10% by mass of methyl acrylate, 15% by mass of 2-hydroxyethyl acrylate, and 20% by mass of glycidyl methacrylate
Heat-curable resin (b): a mixed epoxy resin of 60% by mass of a liquid bisphenol A-type epoxy resin (epoxy equivalent: 180 to 200), 10% by mass of a solid bisphenol A-type epoxy resin (epoxy equivalent: 800 to 900), and 30% by mass of dicyclopentadiene-type epoxy resin (epoxy equivalent: 274 to 286)
Heat-curing agent (c): dicyandiamide (Adeka hardener 3636AS, manufactured by ADEKA Corporation)
Curing accelerator (d): 2-phenyl-4,5-di(hydroxymethyl)imidazole (Curezol 2PHZ, manufactured by Shikoku Chemicals Corporation)
Coloring agent (e): carbon black (#MA650, average particle size: 28 nm, manufactured by Mitsubishi Chemical Corporation)
Coupling agent (f): γ-glycidoxypropyltrimetoxysilane (KBM-403, methoxy equivalent: 12.7 mmol/g, molecular weight: 236.3, manufactured by Shin-Etsu Chemical Co., Ltd.)
Filler (g): amorphous silica filler having an average particle size of 3 μm

[Preparation of Protective Film-Forming Film]

First, a release film (1) (SP-PET381031, manufactured by Lintec Corporation, 38 μm) was coated with a protective film-forming composition with a knife coater so that the thickness after drying might be 25 μm, followed by drying to prepare a protective film-forming film. Next, a release film (2) (SP-PET381130, manufactured by Lintec Corporation, 38 μm) was laminated to the protective film-forming film, and the resulting laminate was wound up as a protective film-forming film supported on release films. The winding body of the resulting protective film-forming film supported on release films had been cut to a width of 300 mm.

A circular half-cutting having a diameter of 220 mm was continuously applied to the central part in the width direction of the winding body prepared as described above so as to cut the release film (2) and the protective film-forming film. Subsequently, the whole release film (2) and the protective film-forming film which is present outside the circle created by half-cutting were removed. Thereby, a release film having a protective film-forming film in which a large number of circular and exposed protective film-forming films are formed on the release film (1) was obtained.

[Preparation of Pressure Sensitive Adhesive Composition]

A methyl ethyl ketone solution (solid concentration: 30% by mass) having the following composition was prepared, and the solution was used as a pressure sensitive adhesive composition.

Acrylic polymer (A)/cross-linking agent (B)=
100/10 (mass ratio)

Acrylic polymer (A): acrylic polymer (weight average molecular weight: 600,000, glass transition temperature: −60° C.) comprising, as monomers, 40% by mass of butyl acrylate, 55% by mass of 2-ethylhexyl acrylate, and 5% by mass of 2-hydroxyethyl acrylate.
Cross-linking agent (B): aromatic polyisocyanate (Takenate D110N, manufactured by Mitsui Chemicals, Inc.)

[Preparation of Pressure Sensitive Adhesive Sheet]

A release film (3) (SP-PET381031, manufactured by Lintec Corporation, 38 μm) was coated with a pressure sensitive adhesive composition with a knife coater and dried so that the film thickness after drying might be 10 μm. Next, a base material made of a corona-treated polypropylene film (manufactured by Mitsubishi Plastics Inc., 80 μm) was laminated to the pressure sensitive adhesive layer after drying to prepare a pressure sensitive adhesive sheet having a release film. The resulting pressure sensitive adhesive sheet having a release film was wound up and cut to a width of 300 mm to prepare a winding body.

Next, a pressure sensitive adhesive sheet obtained by removing the release film (3) from the pressure sensitive adhesive sheet having a release film was laminated to the protective film-forming film side of the release film having a protective film-forming film obtained as described above. Subsequently, an annular cutting having an inner diameter of 270 mm and an outer diameter of 290 mm was applied to the resulting laminate to obtain the protective film-forming composite sheet shown in FIG. 2.

Example 2

A protective film-forming composite sheet was obtained in the same manner as in Example 1 except that the release film (1) to be coated with a protective film-forming composition was changed to a release film (4) (SP-PET381130, manufactured by Lintec Corporation, 38 μm).

Example 3

A protective film-forming composite sheet was obtained in the same manner as in Example 1 except that the release film (1) to be coated with a protective film-forming composition was changed to a release film (5) (SP-PET382150, manufactured by Lintec Corporation, 38 μm).

Example 4

A protective film-forming composite sheet was obtained in the same manner as in Example 1 except that the pressure sensitive adhesive composition was changed to the following composition.

Acrylic polymer (A)/cross-linking agent (B)=
100/5 (mass ratio)

Acrylic polymer (A): acrylic polymer (weight average molecular weight: 800,000, glass transition temperature: −40° C.) comprising, as monomers, 69% by mass of butyl acrylate, 30% by mass of methyl acrylate, and 1% by mass of 2-hydroxyethyl acrylate
Cross-linking agent (B): aromatic polyisocyanate (BHS8515, manufactured by TOYOCHEM Co., Ltd.)

Example 5

A protective film-forming composite sheet was obtained in the same manner as in Example 1 except that the pressure sensitive adhesive composition was changed to the following composition.

Acrylic polymer (A)/cross-linking agent (B)=
100/0.5 (mass ratio)

Acrylic polymer (A): acrylic polymer (weight average molecular weight: 370,000, glass transition temperature: 6° C.) comprising, as monomers, 85% by mass of methyl acrylate and 15% by mass of 2-hydroxyethyl acrylate
Cross-linking agent (B): aromatic polyisocyanate (BHS8515, manufactured by TOYOCHEM Co., Ltd.)

Example 6

A removable pressure sensitive adhesive layer having an inner diameter of 230 mm was formed outside a circular protective film-forming film on a release film of a release film having a protective film-forming film. The removable pressure sensitive adhesive layer was a single layer of a styrene-butadiene copolymer rubber-based pressure sensitive adhesive (manufactured by Asahi Kasei Chemicals Corporation, 25 μm).
A protective film-forming composite sheet shown in FIG. 4 was obtained in the same manner as in Example 1 except that the pressure sensitive adhesive composition was changed to the following composition, and before a pressure sensitive adhesive sheet is bonded to a protective film-forming film having a release film, the pressure sensitive adhesive layer of a pressure sensitive adhesive sheet having a release film was irradiated with ultraviolet rays (illuminance: 220 mW/cm$^2$, quantity of light: 200 mJ/cm$^2$).

Acrylic polymer (A)/cross-linking agent (B)/
photopolymerization initiator=
100/0.5/3 (mass ratio)

Acrylic polymer (A): acrylic polymer obtained by adding 2-isocyanatoethyl methacrylate to hydroxy groups in side chains of a polymer (weight average molecular weight: 400,000, glass transition temperature: −30° C.) obtained by polymerizing 40% by mass of 2-ethylhexyl acrylate, 40% by mass of vinyl acetate, and 20% by mass of 2-hydroxyethyl acrylate, in which when the number of the hydroxy groups is 100 mol, the number of molecules of 2-isocyanatoethyl methacrylate corresponds to 80 mol.
Cross-linking agent (B): aromatic polyisocyanate (BHS8515, manufactured by TOYOCHEM Co., Ltd.)
Photopolymerization initiator: IRGACURE 184, manufactured by BASF JAPAN Ltd.

Example 7

A protective film-forming composite sheet shown in FIG. 6 was obtained in the same manner as in Example 1 except that a second pressure sensitive adhesive layer having a thickness of 10 μm was laminated on a protective film-forming film prepared by coating on the release film (1) followed by drying, and at the half-cutting, the second pressure sensitive adhesive layer was also die-cut into a circular shape together with the protective film-forming film. Note that the composition of the pressure sensitive adhesive forming the second pressure sensitive adhesive layer was as follows.

Acrylic polymer (A)/cross-linking agent (B)=
100/30 (mass ratio)

Acrylic polymer (A): acrylic polymer (weight average molecular weight: 800,000, glass transition temperature: −50° C.) comprising, as monomers, 85% by mass of butyl acrylate and 15% by mass of 2-hydroxylethyl acrylate
Cross-linking agent (B): aromatic polyisocyanate (Takenate D110N, manufactured by Mitsui Chemicals, Inc.)

Comparative Example 1

A protective film-forming composite sheet was obtained in the same manner as in Example 1 except that the release film (1) was changed to a release film (8) (SP-PET38T124-2, manufactured by Lintec Corporation, 38 μm).

Comparative Example 2

A protective film-forming composite sheet was obtained in the same manner as in Example 1 except that the release film (1) was changed to a release film (9) (SP-PET38AL-5, manufactured by Lintec Corporation, 38 μm).

Comparative Example 3

A protective film-forming composite sheet was obtained in the same manner as in Example 1 except that the pressure sensitive adhesive composition was changed to the following composition, and before a pressure sensitive adhesive sheet is bonded to a protective film-forming film having a release film, the pressure sensitive adhesive layer of a pressure sensitive adhesive sheet having a release film was irradiated with ultraviolet rays (illuminance: 220 mW/cm², quantity of light: 200 mJ/cm²).

Acrylic polymer (A)/cross-linking agent (B)/
photopolymerization initiator=
100/0.5/3 (mass ratio)

Acrylic polymer (A): acrylic polymer obtained by adding 2-isocyanatoethyl methacrylate to hydroxy groups in side chains of a polymer obtained by polymerizing 80% by mass of 2-ethylhexyl acrylate and 20% by mass of 2-hydroxyethyl acrylate, in which when the number of the hydroxy groups is 100 mol, the number of molecules of 2-isocyanatoethyl methacrylate corresponds to 80 mol.
Cross-linking agent (B): aromatic polyisocyanate (BHS8515, manufactured by TOYOCHEM Co., Ltd.)
Photopolymerization initiator: IRGACURE 184, manufactured by BASF JAPAN Ltd.

Comparative Example 4

A protective film-forming composite sheet was obtained in the same manner as in Example 1 except that the pressure sensitive adhesive composition was changed to the following composition.
Acrylic polymer (A)/cross-linking agent (B)=100/0.1
Acrylic polymer (A): acrylic polymer comprising, as monomers, 74% by mass of butyl acrylate, 25% by mass of methyl acrylate, and 1% by mass of 2-hydroxyethyl acrylate.
Cross-linking agent (B): aromatic polyisocyanate (BHS8515, manufactured by TOYOCHEM Co., Ltd.)

TABLE 1

| | Peel force α (mN/ 25 mm) | Peel force β (mN/ 25 mm) | Peel force ratio α/β | Peel force γ (mN/ 25 mm) | Peel force γ' (mN/ 25 mm) | Lamination test | Pick-up test |
|---|---|---|---|---|---|---|---|
| Example 1 | 32 | 372 | 0.09 | 417 | 620 | OK | A |
| Example 2 | 24 | 372 | 0.06 | 417 | 620 | OK | A |
| Example 3 | 53 | 372 | 0.14 | 417 | 620 | OK | A |
| Example 4 | 32 | 710 | 0.05 | 1500 | 1100 | OK | A |
| Example 5 | 32 | 90 | 0.36 | 710 | 5000 | OK | B2 |
| Example 6 | 32 | 106 | 0.30 | 606 | 50 | OK | A |
| Example 7 | 32 | 95 | 0.34 | 270 | 1900 | OK | B1 |
| Comparative Example 1 | 200 | 372 | 0.54 | 417 | 620 | NG | A |
| Comparative Example 2 | 400 | 372 | 1.08 | 417 | 620 | NG | A |
| Comparative Example 3 | 32 | 50 | 0.64 | 110 | 40 | NG | A |
| Comparative Example 4 | 32 | 2100 | 0.02 | 2200 | 3600 | OK | F |

As described above, in Examples 1 to 7, the minimum peel force β was 70 mN/25 mm or more and the peel force ratio α/β was 0.50 or less. As a result, when the release film was peeled from the protective film-forming film, delamination did not occur between the protective film-forming film and the pressure sensitive adhesive layer. Thus, the results of the lamination test were good. Further, in Examples 1 to 7, since the maximum peel force γ before curing was 2000 mN/25 mm or less, all the results of the pickup test when chips were picked up before heat curing were good. Similarly, in Examples 1 to 4 and 6 to 7, since the maximum peel force γ' after curing was also 2000 mN/25 mm or less, the results of the pickup test when chips were picked up after heat curing were also good.

On the other hand, in Comparative Examples 1 to 3, the peel force ratio α/β was 0.50 or more. As a result, when the release film was peeled from the protective film-forming film, delamination occurred between the protective film-forming film and the pressure sensitive adhesive layer. Thus, the results of the lamination test were not good. Further, in Comparative Example 4, since both the maximum peel force γ before curing and the maximum peel force γ' after curing were larger than 2000 mN/25 mm, a good result was not obtained in the pickup test.

The invention claimed is:
1. A protective film-forming composite sheet, comprising:
a pressure sensitive adhesive sheet in which a pressure sensitive adhesive layer is provided on a base material,
a protective film-forming film bonded to the pressure sensitive adhesive layer, and
a release film bonded to a surface of the protective film-forming film opposite to a surface bonded to the pressure sensitive adhesive layer,
wherein when α by mN/25 mm represents a maximum peel force between the protective film-forming film and the release film; β by mN/25 mm represents a minimum peel force between the pressure sensitive adhesive sheet and the protective film-forming film; and γ by mN/25 mm represents a maximum peel force between the pressure sensitive adhesive sheet and the protective film-forming film, as measured using a test piece having a width of 25 mm at a peel angle of 180 degrees, a measurement temperature of 23° C., a peel rate of 300 mm/min, and a measurement length of 100 mm in which 10 mm at the start and 10 mm at the end of measurement are excluded from the effective value, the minimum peel force β and the maximum peel force γ are obtained by measuring a load when the pressure sensitive adhesive sheet is peeled from the protective film-forming film, and the minimum value and the maximum value among the resulting measured values of the load are defined as the minimum peel force β and the maximum peel force γ, respectively, the following relationships (1) to (3) hold for α, β, and γ:

$$\beta \geq 70 \tag{1}$$

$$\alpha/\beta \leq 0.50 \tag{2}$$

$$\gamma \leq 2000 \tag{3, and}$$

wherein the protective film-forming film comprises a filler in an amount of from 55 to 80% by mass.
2. The protective film-forming composite sheet according to claim 1, wherein when γ' by mN/25 mm represents a maximum peel force between the protective film-forming film after curing and the pressure sensitive adhesive sheet as measured using a test piece having a width of 25 mm at a peel angle of 180 degrees, a measurement temperature of 23° C., and a peel rate of 300 mm/min, the following relationship (4) is satisfied:

$$\gamma' \leq 2000 \tag{4}$$

3. The protective film-forming composite sheet according to claim 2, wherein the base material is a polypropylene film or a cross-linked film thereof, or a laminated film of at least one of these films and another film.
4. The protective film-forming composite sheet according to claim 1, wherein the pressure sensitive adhesive layer comprises a non-energy ray-curable pressure sensitive adhesive or a pressure sensitive adhesive obtained by curing an energy ray-curable pressure sensitive adhesive.

5. The protective film-forming composite sheet according to claim 2, wherein the pressure sensitive adhesive layer comprises a non-energy ray-curable pressure sensitive adhesive or a pressure sensitive adhesive obtained by curing an energy ray-curable pressure sensitive adhesive.

6. The protective film-forming composite sheet according to claim 3, wherein the pressure sensitive adhesive layer comprises a non-energy ray-curable pressure sensitive adhesive or a pressure sensitive adhesive obtained by curing an energy ray-curable pressure sensitive adhesive.

7. The protective film-forming composite sheet according to claim 1, wherein the minimum peel force $\beta$ is 250 mN/25 mm or more.

* * * * *